(12) United States Patent
Fujikura et al.

(10) Patent No.: US 11,908,902 B2
(45) Date of Patent: Feb. 20, 2024

(54) GROUP III NITRIDE LAMINATE, SEMICONDUCTOR ELEMENT, AND METHOD FOR PRODUCING GROUP III NITRIDE LAMINATE

(71) Applicant: SUMITOMO CHEMICAL COMPANY, LIMITED, Tokyo (JP)

(72) Inventors: Hajime Fujikura, Hitachi (JP); Taichiro Konno, Hitachi (JP); Takeshi Kimura, Hitachi (JP); Osamu Goto, Hitachi (JP)

(73) Assignee: SUMITOMO CHEMICAL COMPANY, LIMITED, Tokyo (JP)

(*) Notice: Subject to any disclaimer, the term of this patent is extended or adjusted under 35 U.S.C. 154(b) by 142 days.

(21) Appl. No.: 17/369,807

(22) Filed: Jul. 7, 2021

(65) Prior Publication Data
US 2022/0028981 A1    Jan. 27, 2022

(30) Foreign Application Priority Data

Jul. 8, 2020    (JP) .................................. 2020-117719

(51) Int. Cl.
*H01L 29/15*    (2006.01)
*H01L 31/0256*    (2006.01)
(Continued)

(52) U.S. Cl.
CPC ........ *H01L 29/205* (2013.01); *H01L 21/0254* (2013.01); *H01L 21/02458* (2013.01);
(Continued)

(58) Field of Classification Search
CPC ............. H01L 29/205; H01L 21/02458; H01L 21/0254; H01L 21/02664; H01L 29/207;
(Continued)

(56) References Cited

U.S. PATENT DOCUMENTS

2004/0245535 A1* 12/2004 D'Evelyn ............... H01L 33/32
257/94
2006/0220039 A1  10/2006  Yokoyama et al.
(Continued)

FOREIGN PATENT DOCUMENTS

JP    2006-286741 A    10/2006

OTHER PUBLICATIONS

Hong Chen, Kuiying Chen, D. A. Drabold, and M. E. Kordesch; Band gap engineering in amorphous AlxGa1ÀxN: Experiment and ab initio calculations; Applied Physics Letters vol. 77, No. 8 Aug. 21, 2000 (Year: 2000).*

*Primary Examiner* — Niki H Nguyen
(74) *Attorney, Agent, or Firm* — Foley & Lardner LLP

(57) ABSTRACT

Provided is a group III nitride laminate for improving device characteristics, including: an underlying substrate; a first layer that is formed on the underlying substrate and is made of aluminum nitride; and a second layer that is formed on the first layer and is made of gallium nitride, wherein the first layer has a thickness of more than 100 nm and 1 μm or less, a full width at half maximum of (0002) diffraction determined through X-ray rocking curve analysis is 250 seconds or less, and a full width at half maximum of (10-12) diffraction determined through X-ray rocking curve analysis is 500 seconds or less.

13 Claims, 10 Drawing Sheets

(51) Int. Cl.
   *H01L 29/205* (2006.01)
   *H01L 29/207* (2006.01)
   *H01L 21/02* (2006.01)
   H01L 29/778 (2006.01)
   H01L 29/20 (2006.01)

(52) U.S. Cl.
   CPC ...... H01L 21/02664 (2013.01); H01L 29/207 (2013.01); *H01L 21/0242* (2013.01); *H01L 21/02378* (2013.01); *H01L 21/02598* (2013.01); *H01L 29/2003* (2013.01); *H01L 29/7786* (2013.01)

(58) Field of Classification Search
   CPC ............ H01L 29/2003; H01L 29/7786; H01L 21/02433; H01L 21/02505; H01L 29/0684; H01L 29/66462; H01L 29/66431; H01L 29/778–7789; H01L 2924/13064; H01L 29/122–127; H01L 29/15–158; C30B 29/403; C30B 29/406; C01B 21/072–0728; C01B 21/0632
   See application file for complete search history.

(56) References Cited

U.S. PATENT DOCUMENTS

| | | | |
|---|---|---|---|
| 2018/0033913 A1* | 2/2018 | Furuya | H01L 21/02505 |
| 2019/0145020 A1* | 5/2019 | Bondokov | C30B 23/066 |
| | | | 438/46 |
| 2020/0194621 A1* | 6/2020 | Hirao | H01L 33/06 |
| 2022/0376053 A1* | 11/2022 | Wong | H01L 29/207 |

* cited by examiner

S10 Underlying substrate preparation step
S20 Nucleation layer formation step
S40 Electron transit layer formation step
S50 Electron supply layer formation step

GROUP III NITRIDE LAMINATE, SEMICONDUCTOR ELEMENT, AND METHOD FOR PRODUCING GROUP III NITRIDE LAMINATE

TECHNICAL FIELD

The present disclosure relates to a group III nitride laminate, a semiconductor element, and a method of producing a group III nitride laminate.

DESCRIPTION OF RELATED ART

A group III nitride-based high electron mobility transistor (HEMT) is widely used as a power amplifier for a cell phone base station (for example, Patent Document 1). In a group III nitride-based HEMT, the power that can be input per element can be significantly increased as compared with a Si-based device that has been used conventionally. As a result, the base station can be miniaturized, which greatly reduces the installation cost.

PRIOR ART DOCUMENT

Patent Document

[Patent Document 1] Japanese Patent Laid-Open Publication No. 2006-286741

SUMMARY OF THE INVENTION

Problems to be Solved by the Invention

An object of the present disclosure is to improve device characteristics.

Means for Solving the Problem

In an aspect of the present disclosure,
there is provided a group III nitride laminate, including:
an underlying substrate,
a first layer including aluminum nitride provided on the underlying substrate, and
a second layer including gallium nitride provided on the first layer;
wherein, in the first layer, a thickness is more than 100 nm and 1 μm or less, a full width at half maximum of (0002) diffraction determined through X-ray rocking curve analysis is 250 seconds or less, and a full width at half maximum of (10-12) diffraction determined through X-ray rocking curve analysis is 500 seconds or less.

In another aspect of the present disclosure,
there is provided a semiconductor element, including the second layer included in the group III nitride laminate according to the above-mentioned aspect as at least a part of an operation layer.

In a still another aspect of the present disclosure,
there is provided a group III nitride laminate, including:
an underlying substrate, and
a first layer including aluminum nitride provided on the underlying substrate,
wherein, in the first layer, a thickness is more than 100 nm and 1 μm or less, a full width at half maximum of (0002) diffraction determined through X-ray rocking curve analysis is 250 seconds or less, and a full width at half maximum of (10-12) diffraction determined through X-ray rocking curve analysis is 500 seconds or less.

In a still another aspect of the present disclosure,
there is provided a method of producing a group III nitride laminate, including:
forming a first layer including aluminum nitride on an underlying substrate,
performing a heat treatment of the first layer under an atmosphere containing hydrogen gas, and
forming a second layer including gallium nitride on the first layer;
wherein, in formation of the first layer, the first layer is formed so that a full width at half maximum of (0002) diffraction of the first layer determined through X-ray rocking curve analysis is 250 seconds or less, and a full width at half maximum of (10-12) diffraction of the first layer determined through X-ray rocking curve analysis is 500 seconds or less, while a thickness of the first layer is more than 100 nm and 1 μm or less.

Advantage of the Invention

According to the present disclosure, device characteristics can be improved.

DETAILED DESCRIPTION OF THE INVENTION

<Knowledges Obtained by the Inventors>

Figure 1:
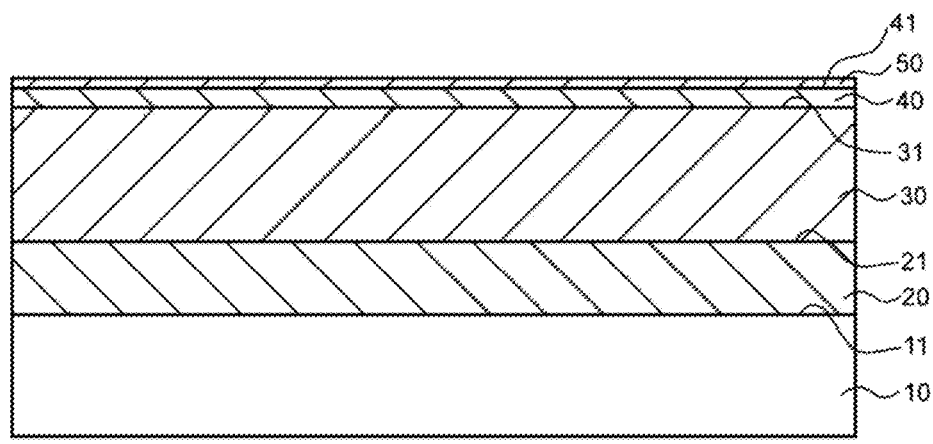
FIG. 1 is a schematic cross-sectional view illustrating a group III nitride laminate according to a first embodiment of the present disclosure.

First, the knowledges obtained by the inventors will be described.

A group III nitride-based HEMT includes, for example, a predetermined underlying substrate, a first layer including aluminum nitride (AlN), a second layer including gallium nitride (GaN), and a third layer having a wide band gap. As device characteristics of such a group III nitride-based HEMT, for example, high mobility, high element reliability, and low buffer leakage current are required.

However, in the group III nitride-based HEMT, it is difficult to optimize device characteristics for the reasons as follows.

In order to obtain high mobility and high reliability, it is required to reduce the dislocation density of the second layer including GaN. As this method, a method of three-dimensionally growing a second layer at an initial stage of growing the second layer on a first layer including AlN can be contemplated. In this method, dislocations are eliminated by meeting each other in a process of three-dimensionally growing the second layer. Thereby, a dislocation density of the second layer can be reduced. By reducing the dislocation density of the second layer, for example, the degradation of the gate electrode can be suppressed. As a result, high mobility and high reliability can be achieved. In this case, a film thickness of the second layer needs to be about 1 μm or more, including a film thickness for three-dimensional growth to sufficiently reduce the dislocation density and a film thickness for subsequent flattening of the second layer.

However, in the above-mentioned method of three-dimensionally growing the second layer, impurities such as oxygen (O) are introduced through an inclined crystal plane (facet) of the island-shaped crystal in the process of the three-dimensionally growing the second layer. In an area where O is introduced in the second layer, O becomes an n-type impurity (donor), so that a free electron concentration increases locally. Therefore, the leakage current (also referred to as buffer leakage current) flowing through a region on the first layer side of the second layer (that is, a three-dimensionally grown region in the second layer) increases. In a case where the above-mentioned buffer leakage current increases when a two-dimensional electron gas (2DEG) of the second layer is pinched off, the on/off current ratio may possibly decrease. Further, when the buffer leakage current is large, the operation of one element of a pair of adjacent elements may affect the operation of the other element.

When the flat second layer is grown thin while the above-mentioned three-dimensional growth of the second layer is suppressed, the dislocation density of the second layer cannot be sufficiently reduced. Therefore, the gate leakage cannot be sufficiently suppressed. As a result, the reliability as an element of the HEMT may be reduced.

On the other hand, a method may be contemplated where impurities such as iron (Fe) and carbon (C) that form deep energy levels are doped at a high concentration near the interface between the first layer including AlN and the second layer including GaN, in order to suppress the above-mentioned buffer leakage current.

However, in this method, the pinch-off voltage varies with a large time constant, associated with the charging and discharging of impurities that form deep energy levels, and so-called hysteresis may occur. Therefore, the operating current may be unstable. Accordingly, a serious trade-off will be produced between the suppression of the above-mentioned buffer leakage current and the stable operation with hysteresis being suppressed.

As mentioned above, it is difficult to achieve at least one of high mobility, high reliability, and low buffer leakage current as the device characteristics in the conventional group III nitride-based HEMT.

The present invention is based on the above knowledges found by the present inventors.

DETAILS OF EMBODIMENT OF THE DISCLOSURE

Next, an embodiment of the present disclosure will be described below with reference to the drawings. The present disclosure is not limited to these illustrations, but intended to be indicated by claims and encompass all the changes which fall within the meaning and scope equivalent to claims.

First Embodiment of the Disclosure

A first embodiment of the present disclosure will be described hereafter, with reference to drawings.

(1) Group III Nitride Laminate

The group III nitride laminate (group III nitride laminated substrate) according to the present embodiment will be described with reference to FIG. 1. FIG. 1 is a schematic cross-sectional view illustrating a group III nitride laminate according to the present embodiment.

Hereinafter, for example, in a crystal of the group III nitride semiconductor having a wurtzite structure, a <0001> axis is referred to as a "c-axis" and a (0001) plane is referred to as a "c-plane". The (0001) plane may be sometimes referred to as a "+c-plane (group III element polar plane)", and a (000-1) plane may be sometimes referred to as a "−c-plane (nitrogen (N) polar plane)". A <1-100> axis (for example, [1-100] axis) is referred to as an "m-axis", and a {1-100} plane is referred to as an "m-plane". A <11-20> axis (for example, [11-20] axis) is referred to as an "a-axis", and a {11-20} plane is referred to as an "a-plane".

As illustrated in FIG. 1, a group III nitride laminate 1 (hereinafter, also referred to as "laminate 1") of the present embodiment includes, for example, an underlying substrate (base substrate) 10, a nucleation layer (first layer) 20, and an electron transit layer (second layer) 30, and an electron supply layer (third layer) 40. The laminate 1 may further include a cap layer (fourth layer) 50. As described later, however, the cap layer 50 is not necessarily provided.

(Underlying Substrate)

The underlying substrate 10 includes silicon carbide (SiC) or sapphire ($Al_2O_3$). Here, the underlying substrate 10 is, for example, a SiC substrate. The polytype of the SiC substrate as the underlying substrate 10 includes, but are not limited to, 4H, 6H or 3C. The SiC substrate as the underlying substrate 10 is preferably semi-insulating.

The underlying substrate 10 has a base surface (main surface) 11. In the present embodiment, the crystal plane with a low index closest to the base surface 11 is, for example, the c-plane ((0001), Si-plane).

The c-axis of the underlying substrate 10 may be inclined at a predetermined off-angle with respect to a normal of the base surface 11. For example, the off-angle of the base surface 11 is preferably more than 0° and 1° or less, and more preferably more than 0° and 0.1° or less. The off-angle of the base surface 11 may have an in-plane distribution within the above-mentioned range. Further, the inclination direction (off direction) of the off angle of the base surface 11 is not limited, but may be, for example, an a-axis direction or an m-axis direction.

The underlying substrate 10 preferably has a large area, for example, in order to improve productivity during production of a semiconductor element. Specifically, a diameter of the underlying substrate 10 is, for example, 2 inches (50.8 mm) or more, preferably 4 inches (100 mm) or more, and more preferably 6 inches (150 mm) or more.

The thickness of the underlying substrate 10 is not particularly limited, but depends on the diameter of the underlying substrate 10. Specifically, the thickness of the underlying substrate 10 having a diameter of 2 inches is, for example, 300 µm or more and 500 µm or less (typically 430 µm), the thickness of the underlying substrate 10 having a diameter of 4 inches is, for example, 400 µm or more and 1000 µm or less (typically 500 µm), and the thickness of the underlying substrate 10 having a diameter of 6 inches is, for example, 400 µm or more and 1500 µm or less (typically 600 µm).

The root mean square roughness RMS of a 5 µm square region of the base surface 11 of the underlying substrate 10 measured with an atomic force microscope (AFM) is, for example, 1 nm or less, and preferably 0.5 nm or less.

(Nucleation Layer)

The nucleation layer 20 is configured, for example, to generate crystal nuclei for growing the electron transit layer 30 mentioned later. Specifically, the nucleation layer 20 includes, for example, AlN. Further, the nucleation layer 20 is provided, for example, on the underlying substrate 10. The nucleation layer 20 is formed, for example, by heteroepitaxially growing a single crystal of AlN on the base surface 11 of the underlying substrate 10.

The nucleation layer 20 has a main surface 21. The term "main surface 21" used herein means a surface on the front surface side (a main surface 31 and a main surface 41, mentioned later, also mean a surface on the front surface side as mentioned above). In the present embodiment, since the nucleation layer 20 is epitaxially grown on the base surface 11 including the c-plane of the underlying substrate 10, the crystal plane with the low index closest to the main surface 21 of the nucleation layer 20 is, for example, the c-plane ((0001), Al-plane).

The thickness of the nucleation layer 20 is, for example, more than 100 nm and 1 µm or less. In the prior art, the thickness of the AlN layer as the nucleation layer 20 is 100 nm or less. Therefore, impurities may diffuse from the underlying substrate 10 to an electron transit layer 30 mentioned later through the nucleation layer 20. Specifically, when a SiC substrate is used as the underlying substrate 10, diffusion of Si from the SiC substrate to the electron transit layer 30 is unavoidable. Therefore, in the prior art, even when the three-dimensional growth of the electron transit layer 30 is not performed, there is a problem that buffer leakage cannot be suppressed, unless impurities such as iron (Fe) and carbon (C) that form a deep energy level are doped at a high concentration near an interface between the nucleation layer 20 including AlN and the electron transit layer 30 including GaN. In contrast, in the present embodiment, since the thickness of the nucleation layer 20 is more than 100 nm, the diffusion of the impurities from the underlying substrate 10 to the electron transit layer 30 through the nucleation layer 20 can be suppressed. Specifically, when the underlying substrate 10 is a SiC substrate, diffusion of Si from the underlying substrate 10 to the electron transit layer 30 can be suppressed. Therefore, buffer leakage can be suppressed, even when impurities such as Fe and C that form a deep energy level are not doped at a high concentration near the interface between the nucleation layer 20 including AlN and the electron transit layer 30 including GaN.

On the other hand, when the thickness of the nucleation layer 20 is more than 1 µm, the laminate 1 may warp or the nucleation layer 20 or the like may be cracked mainly due to a difference in a linear expansion coefficient between the nucleation layer 20 and other layers. In contrast, in the present embodiment, since the thickness of the nucleation layer 20 is 1 µm or less, warpage of the laminate 1 and cracks in the nucleation layer 20 or the like due to the difference in the linear expansion coefficient between the nucleation layer 20 and other layers can be suppressed.

In addition, when the full width at half maximum (FWHM) of a predetermined crystal plane diffraction of AlN determined through X-ray rocking curve analysis is plotted against the thickness of the nucleation layer 20 to which a production method described later is applied, the full width at half maximum of the X-ray diffraction of AlN tends to show a downward convex. Therefore, when the thickness of the nucleation layer 20 is 100 nm or less, the full width at half maximum of the X-ray diffraction of AlN becomes larger. In contrast, in the present embodiment, since the thickness of the nucleation layer 20 is more than 100 nm, so that the increase in the full width at half maximum of X-ray diffraction of AlN can be suppressed. That is, the reduction in crystallinity of the nucleation layer 20 can be suppressed.

Further, the thickness of the nucleation layer 20 is preferably, for example, 200 nm or more and 700 nm or less, and more preferably 300 nm or more and 500 nm or less. With the thickness of the nucleation layer 20 falling within the above range, the full width at half maximum of the X-ray diffraction of AlN can be made smaller. That is, crystallinity of the nucleation layer 20 can be improved.

Specifically, in the nucleation layer 20, for example, having a thickness of more than 100 nm and 1 µm or less, a full width at half maximum of (0002) diffraction of AlN determined through X-ray rocking curve analysis is 250 seconds or less, and a full width at half maximum of (10-12) diffraction of AlN determined through X-ray rocking curve analysis is 500 seconds or less. The unit "second" herein is also called "arcsecond".

In the nucleation layer 20, for example, having a thickness of 200 nm or more and 700 nm or less, the full width at half maximum of (0002) diffraction of AlN determined through X-ray rocking curve analysis is 200 seconds or less, and the full width at half maximum of (10-12) diffraction of AlN determined through X-ray rocking curve analysis is 400 seconds or less.

Further, in the nucleation layer 20, for example, having a thickness of 300 nm or more and 500 nm or less, the full width at half maximum of (0002) diffraction determined through X-ray rocking curve analysis is 180 seconds or less, and the full width at half maximum of (10-12) diffraction determined through X-ray rocking curve analysis is 380 seconds or less.

The crystallinity of the nucleation layer 20 is improved in this way, and thus the crystallinity of an electron transit layer 30 mentioned later formed on the nucleation layer 20 can be improved without introducing three-dimensional growth at the time of growing the electron transit layer 30.

The nucleation layer 20 has strain in a direction along the base surface 11 (for example, a-axis direction), for example, when the HVPE method or the like is used to form the nucleation layer 20 with high quality, as in the present embodiment. The strain amount in the a-axis direction of the nucleation layer 20 depends on, for example, the difference in the linear expansion coefficient (and a difference in a lattice constant) between the underlying substrate 10 and the nucleation layer 20.

The term "strain amount in the a-axis direction" used herein means a ratio of change in the a-axis length (a lattice constant in the a-axis direction) of a crystal constituting a predetermined layer from an a-axis length of a strain-free bulk crystal. A positive value for the strain amount means that the crystal has tensile strain, whereas a negative value for the strain amount means that the crystal has compressive strain.

A strain amount $\varepsilon_1$ (%) in the a-axis direction of the nucleation layer 20 is, for example, determined by the following formula (1):

$$\varepsilon_1 = (a_1 - a_{AlN})/a_{AlN} \times 100 \qquad (1)$$

wherein $a_1$ represents an a-axis length of the AlN crystal that constitutes the nucleation layer 20, and $a_{AlN}$ represents an a-axis length of a strain-free bulk AlN crystal.

A strain amount $\varepsilon_1$ (%) in the a-axis direction of the nucleation layer 20 can be determined, for example, by the following procedure. First, the diffraction angle of (0002) of the nucleation layer 20 is measured by X-ray diffraction analysis (2θ·ω scan), to determine a c-axis length, $c_1$ (a lattice constant in the c-axis direction) of the nucleation layer 20. The c-axis length $c_1$ of the nucleation layer 20, a Poisson's ratio ν of AlN, and a strain amount $\varepsilon_1$ in the a-axis direction of the nucleation layer 20 satisfy the following formula (2):

$$(c_1 - c_{AlN})/c_{AlN} = -2\nu/(1-\nu) \times \varepsilon_1 \qquad (2)$$

Since Poisson's ratio ν in AlN is 0.2, the strain amount $\varepsilon_1$ in the a-axis direction of the nucleation layer 20 can be determined based on the change in the c-axis length $c_1$ by the following formula (3):

$$\varepsilon_1 = -2(c_1 - c_{AlN})/c_{AlN} \qquad (3)$$

Specifically, when the underlying substrate 10 of the present embodiment includes SiC, the strain amount $\varepsilon_1$ (%) in the a-axis direction of the nucleation layer 20 (at room temperature of 27° C.) is, for example, +0.1% or more and +0.5% or less. The strain amount is a positive value, which means that the AlN crystals constituting the nucleation layer 20 have tensile strain.

(Electron Transit Layer)

The electron transit layer 30, for example, is configured to generate a two-dimensional electron gas (2DEG) in a region located on an electron supply layer 40 side and to make electron transitable when the semiconductor element 2 is driven, as described below. Specifically, the electron transit layer 30 includes, for example, GaN. Further, the electron transit layer 30 is provided, for example, on the nucleation layer 20. The electron transit layer 30 is formed, for example, by heteroepitaxially growing a GaN single crystal on the main surface 21 of the nucleation layer 20.

The electron transit layer 30 has, for example, a main surface 31. In the present embodiment, the crystal plane with the low index closest to the main surface 31 of the electron transit layer 30 is, for example, the c-plane ((0001), Ga-plane).

In the present embodiment, the thickness of the electron transit layer 30 is, for example, less than 1 μm. When the thickness of the electron transit layer 30 is 1 μm or more, the laminate 1 may warp mainly due to the difference in the linear expansion coefficient between the electron transit layer 30 and other layers. Therefore, pattern defects may occur at the time of lithography. In addition, GaN itself constituting the electron transit layer 30 is a material that is slightly conductive unless doped with Fe or C as in the prior art. Therefore, an unnecessarily increased thickness of the electron transit layer 30, as in a case where the thickness of the electron transit layer 30 is 1 μm or more, may result in an increased buffer leakage current. In contrast, in the present embodiment, since the thickness of the electron transit layer 30 is less than 1 μm, warpage of the laminate 1 due to the difference in the linear expansion coefficient between the electron transit layer 30 and other layers can be suppressed. Thereby, the lithography accuracy can be improved. Furthermore, in the present embodiment, since the thickness of the electron transit layer 30 is less than 1 μm, the buffer leakage current due to the slight conductivity of the GaN itself constituting the electron transit layer 30 can be suppressed.

The lower limit of the thickness of the electron transit layer 30 is not limited. However, from the viewpoint of generating a predetermined 2DEG in the electron transit layer 30, the thickness of the electron transit layer 30 is preferably 100 nm or more, for example.

In the present embodiment, since the crystallinity of the nucleation layer 20 is improved while the point defect is introduced in the main surface 21 of the nucleation layer 20 during a heat treatment step S30 mentioned later, the strain in the electron transit layer 30 at the time of growing the electron transit layer 30 on the nucleation layer 20 can be relaxed. As a result, in the present embodiment, it is possible to grow a high-quality electron transit layer 30 without three-dimensionally growing the electron transit layer 30.

When the nucleation layer 20 is AlN and the electron transit layer 30 is GaN, a large lattice mismatch (about 2.5%) occurs therebetween, and thereby a strain (lattice strain) is generated. Therefore, at the time of growing the electron transit layer 30, the lattice strain is inevitably relaxed by the introduction of dislocations, in general.

Conventionally, when the GaN layer is three-dimensionally grown to obtain high-quality GaN, the dislocations generated at the GaN/AlN interface meet each other by the three-dimensional growth (by so-called pair annihilation), so that a density of threading dislocations reaching a top of the GaN layer can be reduced to the $10^8$ cm$^{-2}$ range. The GaN layer obtained in this case is in a state close to a strain-free state because the lattice strain is relaxed by the introduction of dislocations during growth. In contrast, the GaN layer is in a state involving the strains (thermal strain) at room temperature resulting from a difference in the thermal expansion coefficient that is produced when the temperature drops after growth.

On the other hand, conventionally, in a case where the GaN layer is not three-dimensionally grown, dislocations are introduced into the GaN layer at the time of growing the GaN layer on the AlN layer, so that the lattice strain is relaxed. Therefore, the GaN layer is in a strain-free state. The dislocation density of the GaN layer at that time gradually decreases due to the above-mentioned pair annihilation as the growth thickness of the GaN increases. However, the degree of decrease in the dislocation density in that case is remarkably lower than that in the case of three-dimensionally growing the GaN layer. Specifically, with the GaN layer having a thickness of about 1 to 2 μm, dislocations of about $10^9$ to $10^{10}$ cm$^{-2}$ will remain on the surface of the GaN layer. The GaN layer obtained in that case is also in a state close to the strain-free state during growth because the lattice strain is relaxed by the introduction of the dislocations. On the other hand, the GaN layer may be in a state involving the thermal strain at room temperature due to the difference in the thermal expansion coefficient that occurs when the temperature drops after growth. However, since the GaN layer has a relatively large number of dislocations, a part of the thermal strain is relaxed by the effect of these dislocations, and the residual strain becomes relatively smaller.

In contrast, in the present embodiment, since the crystallinity of the nucleation layer 20 including AlN is improved while the point defect is introduced in the main surface 21 of the nucleation layer 20 during a heat treatment step S30 mentioned later, the generation of the lattice strain can be suppressed during the growth of the electron transit layer 30 including GaN. Thereby, the generation of the dislocations at the electron transit layer 30/nucleation layer 20 interface (i.e., the GaN/AlN interface) can be suppressed. As a result, the dislocation density of the growing electron transit layer 30 can be $5 \times 10^8$ cm$^{-2}$ or less as described later, even though the lattice strain in the electron transit layer 30 is suppressed. The electron transit layer 30 obtained in this case is in a state close to the strain-free state during growth with the occurrence of dislocations being suppressed. In contrast, the electron transit layer 30 is in a state involving the thermal strain at room temperature due to the difference in the thermal expansion coefficient that occurs when the temperature drops after growth.

A strain amount $\varepsilon_2$ (%) in the a-axis direction of the electron transit layer 30 can be determined, for example, by the following formula (4):

$$\varepsilon_2 = (a_2 - a_{GaN})/a_{GaN} \times 100 \quad (4)$$

wherein $a_2$ represents an a-axis length of the GaN crystal that constitutes the electron transit layer 30, and $a_{GaN}$ represents an a-axis length of a strain-free bulk GaN crystal.

When the underlying substrate 10 of the present embodiment includes SiC, the strain amount $\varepsilon_2$ (%) in the a-axis direction of the electron transit layer 30 (at room temperature of 27° C.) is, for example, +0.05% or more and +0.3% or less.

In the present embodiment, since the lattice strain in the electron transit layer 30 is relaxed at the time of growing the electron transit layer 30 on the high-quality nucleation layer 20, the electron transit layer 30 has high crystallinity even when it is thin. Specifically, even when the thickness of the electron transit layer 30 is within the above-mentioned range, the full width at half maximum of (0002) diffraction of GaN determined through X-ray rocking curve analysis in the electron transit layer 30 is, for example, 200 seconds or less, and preferably 150 seconds or less. The full width at half maximum of (10-12) diffraction of GaN determined through X-ray rocking curve analysis is 400 seconds or less, preferably 300 seconds or less, more preferably 200 seconds or less, and still more preferably 150 seconds or less.

In the present embodiment, since the lattice strain in the electron transit layer 30 is relaxed at the time of growing the electron transit layer 30 on the high-quality nucleation layer 20, the dislocation density of the electron transit layer 30 is reduced as mentioned above, even when the electron transit layer 30 is grown not three-dimensionally nor thickly. Specifically, even when the thickness of the electron transit layer 30 is within the above-mentioned range, the dislocation density in the main surface 31 of the electron transit layer 30 is, for example, $5 \times 10^8$ cm$^{-2}$ or less, preferably less than $1 \times 10^8$ cm$^{-2}$, and more preferably $7 \times 10^7$ cm$^{-2}$ or less. Thereby, the gate leakage when the semiconductor element 2 is driven can be reduced. The dislocation density in the main surface 31 of the electron transit layer 30 can be measured, for example, with a multiphoton excitation microscope.

Since a method which does not allow three-dimensional growth is adopted, the lower limit of the dislocation density in the main surface 31 of the electron transit layer 30 may be, for example, $1 \times 10^7$ cm$^{-2}$.

In the present embodiment, since the electron transit layer 30 is grown with the c-plane as a growth surface (laterally grown) without being three-dimensionally grown by a production method described later, the introduction of impurities such as O through the facet other than the c-plane is suppressed. Specifically, the O concentration in the electron transit layer 30 is, for example, $1 \times 10^{16}$ cm$^{-3}$ or less throughout the electron transit layer 30. As mentioned above, since the introduction of O which becomes an n-type impurity (donor) in the electron transit layer 30 is suppressed, the increase in the free electron concentration in the electron transit layer 30 can be suppressed.

In the present embodiment, when the underlying substrate 10 is a SiC substrate, the thickness of the nucleation layer 20 is more than 100 nm, so that diffusion of Si from the underlying substrate 10 to the electron transit layer 30 can be suppressed. Specifically, the Si concentration in the electron transit layer 30 is, for example, $1 \times 10^{16}$ cm$^{-3}$ or less throughout the electron transit layer 30. As mentioned above, since the introduction of Si which becomes an n-type impurity (donor) in the electron transit layer 30 is suppressed, the increase in the free electron concentration in the electron transit layer 30 can be suppressed.

In the present embodiment, as mentioned above, since the introduction of Si and O which are to be n-type impurities in the electron transit layer 30 is suppressed, there is no need to dope impurities such as Fe and C, which form deep energy levels, at high concentration into the electron transit layer 30. Specifically, each of the Fe concentration and the C concentration in the electron transit layer 30 is, for example, $1 \times 10^{16}$ cm$^{-3}$ or less. Thereby, the charging and discharging of impurities that form deep energy levels can be suppressed at the time of driving the semiconductor element 2.

In the present embodiment, since the electron transit layer 30 is allowed to laterally grow by a production method described below, the electron transit layer 30 has a good surface flatness. Specifically, the root mean square roughness RMS of a 5 μm square region of the main surface 31 of the electron transit layer 30 measured with an atomic force microscope (AFM) is, for example, 1 nm or less, preferably 0.5 nm or less.

(Electron supply layer)

The electron supply layer 40 is configured to generate 2DEG in the electron transit layer 30, for example. Specifically, the electron supply layer 40 includes a group III nitride, which has a wider band gap and a smaller lattice constant, compared to GaN constituting the electron transit layer 30. Examples of the group III nitride constituting the electron supply layer 40 include AlN, AlGaN, InAlN, or AlInGaN, and are represented by a composition formula: $Al_xIn_yGa_{1-x-y}N$ (wherein $0<x\leq1$, $0\leq y<1$, $0<x+y\leq1$). The electron supply layer 40 is provided, for example, on the electron transit layer 30. The electron supply layer 40 is formed, for example, by heteroepitaxially growing the single crystal of the above-mentioned group III nitride on the main surface 31 of the electron transit layer 30.

The electron supply layer 40 has a main surface 41. In the present embodiment, the crystal plane with the low index closest to the main surface 41 of the electron supply layer 40 is, for example, the c-plane ((0001), group III element polar plane).

The thickness of the electron supply layer 40 is, for example, 5 nm or more and 50 nm or less, preferably 10 nm or more and 30 nm or less. When the thickness of the electron supply layer 40 is less than 5 nm, the gate leakage current may increase. In contrast, since the thickness of the electron supply layer 40 is 5 nm or more, the gate leakage current can be reduced. Furthermore, since the thickness of the electron supply layer 40 is 10 nm or more, the gate leakage current can be stably reduced. On the other hand, when the thickness of the electron supply layer 40 is more than 50 nm, the threshold voltage may become higher and the switching characteristics may be deteriorated. In contrast, since the thickness of the electron supply layer 40 is 50 nm or less, the threshold voltage can be a predetermined value or less, and thus the switching characteristics can be improved. Since the thickness of the electron supply layer 40 is 30 nm or less, the switching characteristics can be stably improved.

In the present embodiment, the electron supply layer 40 has good surface flatness, as with the electron transit layer 30. Specifically, the root mean square roughness RMS of a 5 μm square region of the main surface 41 of the electron supply layer 40 measured with an atomic force microscope (AFM) is, for example, equal to that of the electron transit layer 30.

(Cap Layer)

For example, the cap layer 50 is configured to suppress the evaporation of a Ga component or an In component from the main surface 41 of the electron supply layer 40 when the temperature drops after growth. Specifically, the cap layer 50 includes, for example, GaN. The cap layer 50 is provided, for example, on the electron supply layer 40. The cap layer 50 is formed, for example, by heteroepitaxially growing a GaN single crystal on the main surface 41 of the electron supply layer 40. As mentioned above, the cap layer 50 including GaN is formed on the main surface 41 of the electron supply layer 40. Therefore, for example, when the electron supply layer 40 includes AlGaN, selective evaporation of Ga from the surface of AlGaN when the temperature drops after growth can be suppressed, and thus formation of an Al-rich AlGaN layer can be suppressed.

The thickness of the cap layer 50 is, for example, 1 nm or more and 10 nm or less, preferably 2 nm or more and 5 nm or less. When the thickness of the cap layer 50 is less than 1 nm, it is difficult to suppress the evaporation of the Ga component or the In component. In contrast, since the thickness of the cap layer 50 is 1 nm or more, preferably 2 nm or more, evaporation of the Ga component or the In component can be stably suppressed. On the other hand, when the thickness of the cap layer 50 is more than 10 nm, the current component flowing through the cap layer 50 becomes remarkable at the time of fabricating the semiconductor element 2, which may interfere the device operation.

In contrast, since the thickness of the cap layer 50 can be 10 nm or less, preferably 5 nm or less, the generation of the current component flowing through the cap layer 50 can be suppressed. Thereby, the suppression of the device operation caused by the cap layer 50 can be suppressed.

In the laminate 1 configured as mentioned above, since the thickness of the electron transit layer 30 is reduced as mentioned above, the warpage of the laminate 1 can be reduced. Specifically, the warpage of the laminate 1 per length of 50.8 mm is, for example, 20 μm or less, preferably 10 μm or less. Thereby, a decrease in lithography accuracy due to the warpage of the laminate 1 can be suppressed. As a result, the production yield of the semiconductor element 2 can be improved.

The smaller the warpage of the laminate 1, the better. The warpage is, for example, 0 μm or more.

(2) Semiconductor Element

Figure 2:
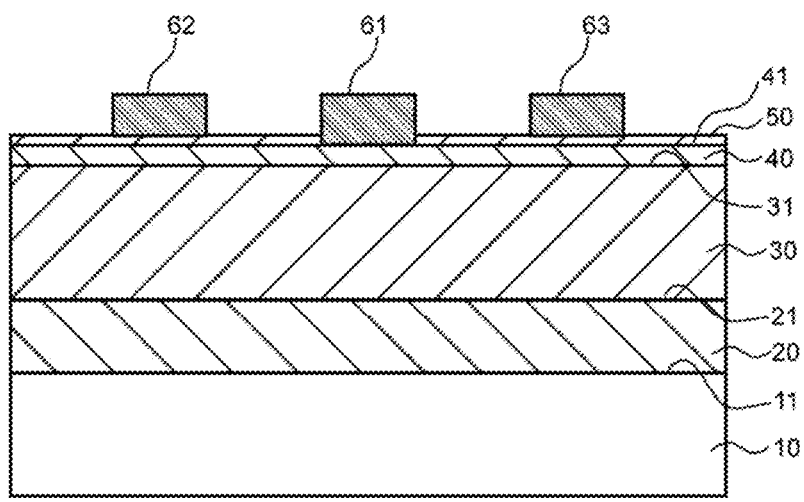
FIG. 2 is a schematic cross-sectional view illustrating a semiconductor element according to the first embodiment of the present disclosure.

Next, the semiconductor element of the present embodiment will be described with reference to FIG. 2. FIG. 2 is a schematic cross-sectional view illustrating the semiconductor element according to the present embodiment.

As illustrated in FIG. 2, the semiconductor element 2 of the present embodiment is produced, for example, using the above-mentioned laminate 1 and is configured as a HEMT. Specifically, the semiconductor element 2 includes, for example, the underlying substrate 10, the nucleation layer 20, the electron transit layer 30, the electron supply layer 40, the cap layer 50, the gate electrode 61, the source electrode 62, and the drain electrode 63. That is, the semiconductor element 2 includes the above-mentioned electron transit layer 30 including GaN as at least a part of the operation layer.

(Electrode)

The gate electrode 61 is provided on the electron supply layer 40. For example, the gate electrode 61 may be in contact with the electron supply layer 40, or may be provided above the electron supply layer 40 with the cap layer 50 intervening therebetween. The gate electrode 61 includes, for example, a multi-layer structure (Ni/Au) including nickel (Ni) and gold (Au).

For example, the source electrode 62 is provided above the electron supply layer 40 with the cap layer 50 intervening therebetween. The source electrode 62 is arranged at a predetermined distance away from the gate electrode 61. The source electrode 62 has, for example, a multi-layer structure (Ti/Al) including titanium (Ti) and aluminum (Al).

For example, the drain electrode 63 is provided above the electron supply layer 40 with the cap layer 50 intervening therebetween. The drain electrode 63 is arranged at a predetermined distance away from the gate electrode 61, on the opposite side of the source electrode 62 across the gate electrode 61. Similar to the source electrode 62, the drain electrode 63 has, for example, a multi-layer structure including Ti and Al. In the source electrode 62 and the drain electrode 63, a Ni/Au multi-layer structure may be laminated on a Ti/Al multi-layer structure.

Figure 3:
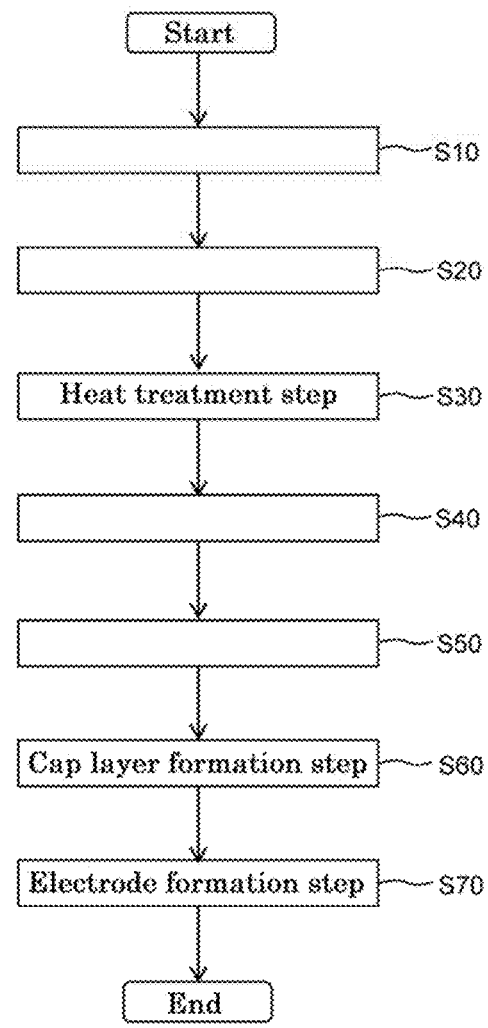
FIG. 3 is a flow chart illustrating a method of producing a group III nitride laminate and a method of producing a semiconductor element according to the first embodiment of the present disclosure.

(3) Method of Producing Group III Nitride Laminate and Method of Producing Semiconductor Element Next, a method of producing the group III nitride laminate and a method of producing a semiconductor element according to the present embodiment will be described with reference to FIG. 1 to FIG. 3. FIG. 3 is a flow chart illustrating a method of producing a group III nitride laminate and a method of producing a semiconductor element according to the present embodiment.

The method of producing the semiconductor element according to the present embodiment includes, for example, an underlying substrate preparation step S10, a nucleation layer formation step S20, a heat treatment step S30, an electron transit layer formation step S40, an electron supply layer formation step S50, a cap layer formation step S60, and an electrode formation step S70.

(S10: Underlying Substrate Preparation Step)

First, an underlying substrate 10 is prepared. As the underlying substrate 10, for example, a polytype 4H semi-insulating SiC substrate is prepared.

(S20: Nucleation Layer Formation Step)

Next, a nucleation layer 20 including a single crystal of AlN is heteroepitaxially grown on the base surface 11 of the underlying substrate 10. The nucleation layer 20 is grown by, for example, a hydride vapor phase epitaxy (HVPE) method.

As the group III (Al) source gas, for example, aluminum monochloride (AlCl) gas or aluminum trichloride (AlCl$_3$) gas is used. AlCl gas or AlCl$_3$ gas can be generated by supplying hydrogen chloride (HCl) gas onto metal Al placed in an HVPE equipment. As an N source gas, for example, ammonia (NH$_3$) gas is used. These source gases may be mixed and supplied with a carrier gas including hydrogen (H$_2$) gas, nitrogen (N$_2$) gas, or a mixed gas thereof.

At this time, in the present embodiment, the nucleation layer 20 is formed so that the crystallinity of the nucleation layer 20 is enhanced.

For example, the nucleation layer 20 is formed so that a full width at half maximum of (0002) diffraction of AlN determined through X-ray rocking curve analysis is 250 seconds or less, and a full width at half maximum of (10-12) diffraction of AlN determined through X-ray rocking curve analysis is 500 seconds or less, while the thickness of the nucleation layer 20 is more than 100 nm and 1 µm or less.

Preferably, for example, the nucleation layer 20 is formed so that a full width at half maximum of (0002) diffraction of AlN determined through X-ray rocking curve analysis is 200 seconds or less, and a full width at half maximum of (10-12) diffraction of AlN determined through X-ray rocking curve analysis is 400 seconds or less, while the thickness of the nucleation layer 20 is 200 nm or more and 700 nm or less.

More preferably, for example, the nucleation layer 20 is formed so that a full width at half maximum of (0002) diffraction of AlN determined through X-ray rocking curve analysis is 180 seconds or less, and a full width at half maximum of (10-12) diffraction of AlN determined through X-ray rocking curve analysis is 380 seconds or less, while the thickness of the nucleation layer 20 is 300 nm or more and 500 nm or less.

A method of forming the high-quality nucleation layer 20 includes controlling crystal growth. As the crystal growth conditions, for example, at least any one of growth temperature, V/III ratio, growth rate, and growth pressure is appropriately controlled. Thereby, the high-quality nucleation layer 20 can be grown. The term "V/III ratio" used herein means a ratio of a supply amount (partial pressure) of a group V(N) source gas to a supply amount (partial pressure) of a group III (Al) source gas.

Specifically, the crystal growth conditions are set as follows, for example.

Growth temperature: 900° C. or more and 1300° C. or less
V/III ratio: 0.2 or more and 200 or less
Growth rate: 0.5 nm/min or more and 3000 nm/min or less
Growth pressure: 0.9 atm or more and 1.3 atm or less At this time, the pressure at the time of crystal growth (growth pressure) is preferably 0.9 atm or more and 1.3 atm or less, which is close to atmospheric pressure, as mentioned above. Since the growth pressure is 0.9 atm or more, namely growth is performed at a pressure higher than a pressure in a case where a reduced pressure growth equipment is used, the high-quality nucleation layer 20 can be easily grown. On the other hand, the growth pressure of more than 1.3 atm does not bring a disadvantage from a viewpoint of crystal growth, but requires a growth equipment that can withstand such a high pressure. Therefore, the growth pressure is preferably 1.3 atm or less from a viewpoint of production cost.

At that time, for the purpose of preventing attachment of AlN to nozzles of gas supply pipes used to introduce various gases to a growth chamber of the HVPE equipment, HCl gas may be allowed to flow. In this case, the ratio of the supply amount of HCl gas to that of AlCl gas or AlCl$_3$ gas is, for example, 0.1 or more and 100 or less.

Further, as a method of forming the high-quality nucleation layer 20 as mentioned above, for example, a heat treatment (annealing treatment) may be performed in an atmosphere containing N$_2$ gas after the nucleation layer 20 is grown. At this time, for example, the heat treatment temperature is preferably 1400° C. or more and 1700° C. or less, for example.

Since the crystal growth conditions are controlled as mentioned above, the crystallinity of the nucleation layer 20 can be improved.

When the crystallinity of the nucleation layer 20 obtained as in the present embodiment is high, tensile strain will occur in the nucleation layer 20 due to the difference in the linear expansion coefficients between the underlying substrate 10 and the nucleation layer 20, when the temperature drops after the nucleation layer formation step S20 or when the temperature drops after a heat treatment step S30 mentioned below. On the other hand, as in the past, when the crystallinity of the nucleation layer 20 is low, that is, in a case where the nucleation layer 20 contains many dislocations, the thermal strain is relaxed due to the presence of dislocations, so that the residual strain around room temperature becomes relatively smaller (less than +0.05%).

(S30: Heat Treatment Step)

Next, the heat treatment is performed on the nucleation layer 20. The heat treatment step S30, for example, is performed continuously in the growth chamber of the same HVPE equipment without lowering the temperature after the nucleation layer formation step S20. The heat treatment step S30 may be performed in a separate equipment after the nucleation layer formation step S20.

In the present embodiment, for example, the heat treatment is performed on the nucleation layer 20 in an atmosphere containing H$_2$ gas. H$_2$ gas may be mixed and supplied with an inert gas such as N$_2$ gas, or argon gas (Ar gas).

Performing the heat treatment in an atmosphere containing H$_2$ gas makes it possible to modify the main surface 21 of the nucleation layer 20 such that the strain in the electron transit layer 30 grown on the main surface 21 of the nucleation layer 20 is relaxed. A mechanism of strain relaxation of the electron transit layer 30 is not clear at present, but the following mechanism is proposed by way of example. That is, in the heat treatment step S30, since H$_2$ gas is contained in the atmosphere, the point defect is introduced in the AlN crystal constituting the nucleation layer 20. Specifically, N atom in AlN binds to H on the surface to form NH$_3$, which is eliminated. Therefore, a large amount of N vacancies are formed in AlN, and the N vacancies act as atomic-sized voids. As a result, it is considered that the strain in the electron transit layer 30 grown on the nucleation layer 20 can be relaxed.

At that time, the heat treatment is preferably performed on the nucleation layer 20 in an atmosphere substantially free of NH$_3$ gas. As used herein, the expression "substantially free of NH$_3$ gas" means that, for example, a partial pressure of NH$_3$ gas in the growth chamber is less than 1% of the total pressure. Specifically, this step is performed without supplying NH$_3$ gas into the growth chamber, for example. Here, when the heat treatment is performed on the nucleation layer 20 in an atmosphere containing NH$_3$ gas, it becomes difficult to sufficiently introduce the point defect into the AlN crystals constituting the nucleation layer 20. Therefore, it may be impossible to sufficiently relax the strain in the electron transit layer 30 grown on the nucleation layer 20. In contrast, in the present embodiment, since the heat treatment is performed on the nucleation layer 20 in an atmosphere substantially free of NH$_3$ gas, the point defect can be sufficiently introduced into the AlN crystals constituting the nucleation layer 20.

When the heat treatment step S30 is continuously performed in the growth chamber of the same HVPE equipment after the nucleation layer formation step S20, the NH$_3$ gas introduced in the nucleation layer formation step S20 may remain in the growth chamber. Therefore, it is preferable to discharge (or replace) all the gases in the growth chamber before performing the heat treatment step S30.

As mentioned above, in the heat treatment step S30, it is considered that N atom in AlN binds to H on the surface to form NH$_3$, which is eliminated, but the amount of NH$_3$ produced by the elimination is very small. Therefore, due to the eliminated NH$_3$, the partial pressure of NH$_3$ gas in the growth chamber does not exceed 1% of the total pressure.

At this time, the heat treatment temperature is preferably 900° C. or more and 1300° C. or less, for example. The main surface 21 of the nucleation layer 20 is less likely to be modified at the heat treatment temperature of less than 900° C. In contrast, since the heat treatment temperature is 900° C. or more, the main surface 21 of the nucleation layer 20 can be sufficiently modified. On the other hand, when the heat treatment temperature is more than 1300° C., the main surface 21 of the nucleation layer 20 may be decomposed. In contrast, since the heat treatment temperature is 1300° C. or less, decomposition of the main surface 21 of the nucleation layer 20 can be suppressed.

At this time, the heat treatment time is preferably 10 minutes or more and 120 minutes or less, for example. When the heat treatment time is less than 10 minutes, the main surface 21 of the nucleation layer 20 is less likely to be modified. In contrast, since the heat treatment time is 10 minutes or more, the main surface 21 of the nucleation layer 20 can be sufficiently modified. On the other hand, when the heat treatment time is more than 120 minutes, flatness of the main surface 21 of the nucleation layer 20 may be reduced. In contrast, since the heat treatment time is 120 minutes or less, a reduction in the flatness of the main surface 21 of the nucleation layer 20 can be suppressed.

Further, the heat treatment time is more preferably 30 minutes or more and 90 minutes or less, and most preferably 60 minutes. Since the heat treatment time is appropriately controlled as mentioned above, an appropriate amount of point defects can be introduced in the main surface 21 of the nucleation layer 20, while the surface condition of the main surface 21 of the nucleation layer 20 is kept flat. Thereby, the crystallinity of the electron transit layer 30 formed on the nucleation layer 20 can be more stably improved.

(S40: Electron Transit Layer Formation Step)

Next, the electron transit layer 30 including GaN single crystal is heteroepitaxially grown on the main surface 21 of the nucleation layer 20 that has undergone the heat treatment. The electron transit layer 30 is grown by, for example, a metalorganic vapor phase epitaxy (MOVPE) method.

As the group III (Ga) source gas, for example, trimethylgallium (Ga(CH$_3$)$_3$, TMG) gas is used. As an N source gas, for example, NH$_3$ gas is used. These source gases may be mixed and supplied with a carrier gas including hydrogen (H$_2$) gas, nitrogen (N$_2$) gas, or a mixed gas thereof.

In the present embodiment, the base surface 11 of the underlying substrate 10 is covered with the nucleation layer 20 including AlN. Thereby, it is possible to start with a supply of NH$_3$ gas into a film formation chamber of the MOVPE equipment. As a result, it is not necessary to bake the film forming chamber in advance. The effect in this regard will be described later.

In the present embodiment, since the crystallinity of the nucleation layer 20 is improved during the nucleation layer formation step S20 while the point defect is introduced in the main surface 21 of the nucleation layer 20 during the heat treatment step S30 as mentioned above, the lattice strain in the electron transit layer 30 at the time of growing the electron transit layer 30 on the nucleation layer 20 can be relaxed. Thereby, it is possible to form the electron transit layer 30 having high crystallinity while reducing the thickness of the electron transit layer 30.

Specifically, the electron transit layer 30 can be formed so that a full width at half maximum of (0002) diffraction of GaN determined through X-ray rocking curve analysis is 200 seconds or less, and a full width at half maximum of (10-12) diffraction of GaN determined through X-ray rocking curve analysis is 400 seconds or less, while a thickness of the electron transit layer 30 is less than 1 μm.

Also, in the present embodiment, the electron transit layer 30 is laterally grown (two-dimensionally grown) without being three-dimensionally grown. That is, the electron transit layer 30 is grown only with the c-plane as a growth surface without producing a facet other than the c-plane (step-flow grown).

As the crystal growth conditions for laterally growing the electron transit layer 30, for example, at least any one of growth temperature, growth rate, and growth pressure is appropriately controlled.

Specifically, the growth temperature of the electron transit layer 30 is higher than a growth temperature of a typical GaN crystal, for example, 1080° C. or more and 1200° C. or less, preferably 1100° C. or more and 1150° C. or less.

The growth rate during the electron transit layer formation step S40 is, for example, 10 nm/min or more and 30 nm/min or less.

The growth pressure during the electron transit layer formation step S40 is, for example, 0.01 atm or more and 0.5 atm or less.

In the MOVPE method, C derived from an organometallic gas as a group III source may be incorporated into the growing film even when C (carbon) is not intentionally introduced. In the present embodiment, however, since the V/III ratio during the electron transit layer formation step S40 is, for example, 3000 or more under the above-mentioned conditions where the electron transit layer 30 is not three-dimensionally grown, the introduction of C into the electron transit layer 30 can be reduced to $1 \times 10^{16}$ cm$^{-3}$ or less.

In the present embodiment, since the strain in the electron transit layer 30 grown on the high-quality nucleation layer 20 is relaxed, as mentioned above, the dislocation density of the electron transit layer 30 can be reduced, even when the electron transit layer 30 is grown not three-dimensionally nor thickly. Specifically, the electron transit layer 30 can be formed so that a dislocation density on a main surface 31 of the electron transit layer 30 is $5\times10^8$ cm$^{-2}$ or less while the thickness of the electron transit layer 30 is less than 1 µm.

In the present embodiment, since the electron transit layer 30 is laterally grown without being three-dimensionally grown as mentioned above, the introduction of impurities such as O through the facet other than the c-plane can be suppressed. Specifically, for example, the electron transit layer 30 can be formed so that the O concentration in the electron transit layer 30 is $1\times10^{16}$ cm$^{-3}$ or less throughout the electron transit layer 30.

In the present embodiment, as mentioned above, since the introduction of O or the like which is to be an n-type impurity in the electron transit layer 30 is suppressed, impurities such as Fe and C which form deep energy levels are not intentionally doped into the electron transit layer 30. Specifically, the electron transit layer 30 can be formed so that, for example, each of the Fe concentration and the C concentration in the electron transit layer 30 is $1\times10^{16}$ cm$^{-3}$ or less.

In the present embodiment, as mentioned above, since the thickness of the electron transit layer 30 is thin, the growth rate can be reduced, for example, to 30 nm/min or less. Here, the amount of C incorporated into the growing membrane tends to increase as the growth rate increases. Therefore, in the present embodiment, since the growth rate is reduced as described above, a high-purity electron transit layer 30 can be easily obtained. That is, even when the MOVPE method is used, the C concentration can be easily reduced to $1\times10^{16}$ cm$^{-3}$ or less as mentioned above. In this case, the growth time is slightly longer, but the decrease in productivity can be suppressed because the thickness of the electron transit layer 30 is thin.

(S50: Electron Supply Layer Formation Step)

Next, the electron supply layer 40 including a single crystal of a group III nitride is heteroepitaxially grown on the main surface 31 of the nucleation layer 30, the group III nitride having a band gap wider than that of the GaN constituting the electron transit layer 30. The growth of the electron supply layer 40 is performed, for example, by the MOVPE method. Therefore, the electron supply layer formation step S50, for example, is performed continuously in the growth chamber of the same MOVPE equipment after the electron transit layer formation step S40.

In the present embodiment, for example, the electron supply layer 40 including a single crystal of AlN, AlGaN, InAlN, or AlInGaN is grown.

As an Al source gas, for example, trimethylalminum (Al(CH$_3$)$_3$, TMA) gas is used. As an In source gas, for example, trimethylindium (In((CH$_3$)$_3$, TMI) gas is used. For other gases, the gas similar to that in electron transit layer formation step S40 is used.

The thickness of the electron supply layer 40 is, for example, 5 nm or more and 50 nm or less.

(S60: Cap Layer Formation Step)

Next, the cap layer 50 including GaN is grown on the main surface 41 of the electron supply layer 40.

The growth of the cap layer 50 is performed, for example, by the MOVPE method, but not particularly limited thereto. In this case, it is preferable that the cap layer formation step S60 is also performed continuously after the electron supply layer formation step S50.

The thickness of the cap layer 50 is, for example, 1 nm or more and 10 nm or less.

As mentioned above, the laminate 1 of the present embodiment is produced.

(S70: Electrode Formation Step)

After the laminate 1 is produced, the gate electrode 61, the source electrode 62 and the drain electrode 63 are formed above the electron supply layer 40.

Specifically, resist patterning, predetermined metal film formation, and lift-off are performed in this order to form a source electrode 62 and a drain electrode 63 including Ti/Al in a predetermined region on the cap layer 50. Then, the laminate 1 is subjected to the heat treatment (for example, at 650° C. for 3 minutes) in N$_2$ atmosphere. Thereby, each of the source electrode 62 and the drain electrode 63 is ohmic-bonded to the cap layer 50.

Next, resist patterning is performed so that a region for forming the gate electrode 61 becomes an opening in a plan view, and the cap layer 50 in the region for forming the gate electrode 61 is etched using a resist film as a mask. As the etching method for the cap layer 50, for example, reactive ion etching (RIE), inductively coupled plasma etching, or electrochemical etching is used.

After etching the cap layer 50 in the predetermined region, a predetermined metal film formation and lift-off are performed in this order so that the gate electrode 61 is formed in the above-mentioned predetermined region of the electron supply layer 40. Then, the laminate 1 is subjected to the heat treatment (for example, at 450° C. for 10 minutes) in N$_2$ atmosphere.

After forming the gate electrode 61, the source electrode 62 and the drain electrode 63 as described above, the laminate 1 is diced and cut into chips of a predetermined size.

As mentioned above, the semiconductor element 2 of the present embodiment is produced.

(4) Effect Obtained by the Present Embodiment

According to the present embodiment, one or more of the following effects are obtained.

(a) In the present embodiment, in the nucleation layer 20 including AlN, a thickness is more than 100 nm and 1 µm or less, a full width at half maximum of (0002) diffraction of AlN determined through X-ray rocking curve analysis is 250 seconds or less, and a full width at half maximum of (10-12) diffraction of AlN determined through X-ray rocking curve analysis is 500 seconds or less. Since the crystallinity of the nucleation layer 20 is improved in this way, the crystallinity of the electron transit layer 30 formed on the nucleation layer 20 can be improved. As a result, the characteristics of the semiconductor element 2 can be improved.

(b) In the present embodiment, since the crystallinity of the nucleation layer 20 is improved while the point defect is introduced in the main surface 21 of the nucleation layer 20 during a heat treatment step S30, the strain in the electron transit layer 30 grown on the nucleation layer 20 can be relaxed. In other words, since the electron transit layer 30 is grown on the main surface 21 of the nucleation layer 20 having high crystallinity, the electron transit layer 30 can be grown with the crystal axis (c-axis) aligned. Furthermore, since the point defect is introduced in the main surface 21 of the nucleation layer 20 during the heat treatment step S30, the region, into which the point defect is introduced, of the nucleation layer 20 can function as a stress buffering region for relaxing stress generated between the nucleation layer 20 and the electron transit layer 30. As a result, the strain in the electron transit layer 30 can be relaxed.

(c) In the present embodiment, since the strain in the electron transit layer 30 grown on the high-quality nucleation layer 20 is relaxed, the crystallinity of the electron transit layer 30 can be improved, even when the thickness of the electron transit layer 30 is thin. Specifically, in the electron transit layer 30, the thickness is less than 1 µm, the full width at half maximum of (0002) diffraction of GaN determined through X-ray rocking curve analysis is 200 seconds or less, and the full width at half maximum of (10-12) diffraction of GaN determined through X-ray rocking curve analysis is 400 seconds or less. Since the crystallinity of the electron transit layer 30 is improved in this way, the mobility of the electron transit layer 30 can be improved while the degradation of the gate electrode can be suppressed, and thus reliability of the element can be improved.

(d) In the present embodiment, since the strain in the electron transit layer 30 grown on the high-quality nucleation layer 20 is relaxed, the dislocation density of the electron transit layer 30 can be reduced, even when the electron transit layer 30 is grown not three-dimensionally nor thickly. Specifically, even when the thickness of the electron transit layer 30 is within the above-mentioned range, the dislocation density in the main surface 31 of the electron transit layer 30 can be $5 \times 10^8$ cm$^{-2}$ or less. Thereby, the degradation of the gate electrode when the semiconductor element 2 is driven can be suppressed. As a result, the reliability of the semiconductor element 2 as the HEMT can be improved.

(e) In the present embodiment, since the electron transit layer 30 is laterally grown without being three-dimensionally grown, the introduction of impurities such as O through the facet other than the c-plane can be suppressed. Specifically, the O concentration in the electron transit layer 30 can be $1 \times 10^{16}$ cm$^{-3}$ or less throughout the electron transit layer 30.

In addition, in the present embodiment, since the thickness of the nucleation layer 20 is more than 100 nm, diffusion of impurities from the underlying substrate 10 to the electron transit layer 30 via the nucleation layer 20 can be suppressed. Specifically, when the underlying substrate 10 is a SiC substrate, diffusion of Si from the underlying substrate 10 to the electron transit layer 30 can be suppressed. As a result, the Si concentration in the electron transit layer 30 can be $1 \times 10^{16}$ cm$^{-3}$ or less throughout the electron transit layer 30.

Thus, since the introduction of Si and O which are to be n-type impurities in the electron transit layer 30 is suppressed, the increase in the free electron concentration in the electron transit layer 30 can be suppressed. Since the increase in the free electron concentration in the electron transit layer 30 is suppressed, the increase in the buffer leakage current can be suppressed. When the 2DEG of the second layer is pinched off, the increase in the buffer leakage current is suppressed, so that the decrease in the on/off current ratio can be suppressed. Further, the increase in the buffer leakage current is suppressed, so that the leakage current between the elements can be suppressed, and the interference of the operation between the adjacent elements can be suppressed.

(f) In the present embodiment, since the introduction of Si and O which are to be n-type impurities in the electron transit layer 30 is suppressed, there is no need to dope impurities such as Fe and C, which form deep energy levels, at high concentration into the electron transit layer 30. Specifically, each of the Fe concentration and the C concentration in the electron transit layer 30 is $1 \times 10^{16}$ cm$^{-3}$ or less. Thereby, the charging and discharging of impurities that form deep energy levels can be suppressed when the semiconductor element 2 is driven. That is, the occurrence of hysteresis associated with the charging and discharging of impurities can be suppressed. As a result, the semiconductor element 2 can be stably operated.

As mentioned above, in the present embodiment, the suppression of the buffer leakage current can be compatible with the stable operation with suppressed hysteresis.

(g) In the present embodiment, the base surface 11 of the underlying substrate 10 is covered with the nucleation layer 20 including AlN at the beginning of the electron transit layer formation step S40. Thereby, it is possible to start with a supply of NH$_3$ gas into a film formation chamber of the vapor phase epitaxy equipment in the electron transit layer formation step S40. That is, even when starting with the supply of NH$_3$ gas, the base surface 11 of the underlying substrate 10 including SiC can be suppressed from being transformed into silicon nitride (SiN) that inhibits the crystal growth of the group III nitride.

Starting with the supply of NH$_3$ gas into the film formation chamber enables transformation of the Ga attached to the inside of the growth equipment into GaN, and suppression of the vaporization of the Ga. Thereby the attachment of Ga on the base surface 11 of the underlying substrate 10 can be suppressed. That is, it is not necessary to bake the film formation chamber of the vapor phase epitaxy equipment in advance in order to remove Ga attached to the inside of the growth equipment. As a result, the production time of the laminate 1 can be greatly shortened, and the productivity of the laminate 1 can be remarkably improved.

Second Embodiment of the Disclosure

Next, a second embodiment of the present disclosure will be described.

In the above-mentioned first embodiment, the case where the laminate 1 includes at least the electron transit layer 30 on the nucleation layer 20 has been described, but the present disclosure is not limited thereto. The configuration of the laminate 1 may be modified as in a present embodiment mentioned below.

Hereinafter, only the elements different from the elements in the above-mentioned embodiments will be described, and the elements substantially the same as the elements described in the above-mentioned embodiments will be designated by the same reference numerals and the explanation thereof will be omitted.

(1) Group III Nitride Laminate

Figure 4:
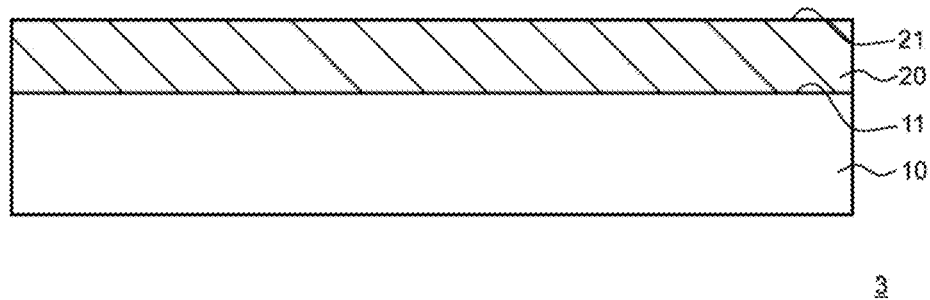
FIG. 4 is a schematic cross-sectional view illustrating a group III nitride laminate according to a second embodiment of the present disclosure.

The group III nitride laminate according to the present embodiment will be described with reference to FIG. 4. FIG. 4 is a schematic cross-sectional view illustrating a group III nitride laminate according to the present embodiment.

As illustrated in FIG. 4, the laminate 1 of the present embodiment includes, for example, an underlying substrate 10 and a nucleation layer 20. In other words, the laminate 1 of the present embodiment is similar to the laminate 1 of the first embodiment, except that the laminate 1 of the present embodiment does not include the electron transit layer 30, the electron supply layer 40, and the cap layer 50.

The nucleation layer 20 has high crystallinity like the nucleation layer 20 of the above-mentioned first embodiment. That is, in the nucleation layer 20, a thickness is more than 100 nm and 1 µm or less, a full width at half maximum of (0002) diffraction of AlN determined through X-ray rocking curve analysis is 250 seconds or less, and a full width at half maximum of (10-12) diffraction of AlN determined through X-ray rocking curve analysis is 500 seconds or less.

The nucleation layer 20 has, for example, a main surface 21 on which the electron transit layer 30 including GaN is formed. The main surface 21 of the nucleation layer 20, for example, has been subjected to the heat treatment step S30, and the point defect has been introduced. That is, the main surface 21 of the nucleation layer 20 is configured to enable the electron transit layer 30 to be grown so that the strain in the electron transit layer 30 is relaxed.

That is, the main surface 21 of the nucleation layer 20 is configured to enable the electron transit layer 30 having high crystallinity to be grown even when the thickness of the electron transit layer 30 is thin. Specifically, the main surface 21 of the nucleation layer 20 is configured to enable the electron transit layer 30 to be grown so that the full width at half maximum of (0002) diffraction of the electron transit layer 30 determined through X-ray rocking curve analysis is 200 seconds or less, and the full width at half maximum of (10-12) diffraction of the electron transit layer 30 determined through X-ray rocking curve analysis is 400 seconds or less, while a thickness of the electron transit layer 30 is less than 1 µm.

Further, the main surface 21 of the nucleation layer 20 is configured to enable the electron transit layer 30 to be grown so that the dislocation density of the electron transit layer 30 becomes lower even when the thickness of the electron transit layer 30 is thin. Specifically, the main surface 21 of the nucleation layer 20 is configured to enable the electron transit layer 30 to be grown so that a dislocation density in the main surface 31 of the electron transit layer 30 is $5 \times 10^8$ cm$^{-2}$ or less while the thickness of the electron transit layer 30 is less than 1 µm.

(2) Effect Obtained by the Present Embodiment

In the present embodiment, even when the laminate 1 includes only the underlying substrate 10 and the nucleation layer 20, the same effect as that of the above-mentioned first embodiment can be obtained. For example, even when a manufacturer that manufactures a laminate 1 including only an underlying substrate 10 and a nucleation layer 20 provides the laminate 1 to a manufacturer that manufactures a semiconductor element 2, the manufacturer that manufactures a semiconductor element 2 can easily grow a high-quality electron transit layer 30 and the like. As a result, a semiconductor element 2 having good device characteristics can be easily produced.

OTHER EMBODIMENTS

As described above, explanations have been given specifically for the above-mentioned embodiments of the present disclosure. However, the present disclosure is not limited thereto, and can be variously modified in a range not departing from the gist of the disclosure. The term "above-mentioned embodiments" encompasses the first embodiment and the second embodiment.

In the above-mentioned embodiments, the case where the underlying substrate 10 is a SiC substrate has been described, but the underlying substrate 10 may be a sapphire substrate. Even in this case, the strain in the electron transit layer 30 can be relaxed by the above-mentioned production method. In this case, however, the strain amount in each layer is different from that of the above-mentioned embodiments. Specifically, the strain amount $\varepsilon_1$ (%) in the a-axis direction of the nucleation layer 20 is, for example, −0.5% or more and −0.1% or less (i.e., compressive strain). The strain amount $\varepsilon_2$ (%) of the electron transit layer 30 in the a-axis direction is, for example, −0.2% or more and +0.2% or less.

In the above-mentioned embodiment, the case where the cap layer 50 is provided has been described, but the cap layer 50 does not have to be provided.

In the above-mentioned embodiments, the top surface of the cap layer 50 is illustrated as having nothing provided on the region excluding the electrodes, but a protective film may be provided to cover the top surface of the cap layer 50 excluding the electrodes. Examples of the protective film include silicon nitride (SiN).

In the above-mentioned embodiments, a case where the semiconductor element 2 is configured as a so-called MES gate (Metal-Semiconductor) type in which the gate electrode 61 is in direct contact with a semiconductor layer such as the electron supply layer 40 has been described. However, the semiconductor element 2 may be configured as a so-called MIS gate (Metal-Insulator-Semiconductor) type in which an insulating layer including silicon oxide ($SiO_2$) or aluminum oxide ($Al_2O_3$) is inserted between a semiconductor layer such as the electron supply layer 40 and the gate electrode 61.

In the above-mentioned embodiments, a case where the nucleation layer 20 is grown by the HVPE method has been described, but the nucleation layer 20 may be grown by the MOVPE method.

In the above-mentioned embodiments, a case where the electron transit layer 30 is grown by the MOVPE method has been described, but the electron transit layer 30 may be grown by the HVPE method.

In the above-mentioned embodiments, a case has been described where the nucleation layer formation step S20 and the heat treatment step S30 are performed in the HVPE equipment, and then the electron transit layer formation step S40 is performed in the distinct MOVPE equipment, but not limited thereto. As a modified example, the nucleation layer 20 may include, for example, a first AlN layer and a second AlN layer, and the nucleation layer formation step S20 may include, for example, a first AlN layer formation step and a second AlN layer formation step. As in the above-mentioned embodiments, especially when the nucleation layer formation step S20 and the heat treatment step S30 are performed in an equipment distinct from an equipment in which the electron transit layer formation step S40 is performed, impurities may attach to the main surface 21 of the nucleation layer 20 before the formation of the electron transit layer 30. In contrast, in the above-mentioned modified example, since the nucleation layer formation step S20 is divided into a first AlN layer formation step and a second AlN layer formation step, the first AlN layer formation step can be firstly performed in the HVPE equipment, and then the second AlN layer formation step, the heat treatment step S30, and the electron transit layer formation step S40 can be performed in the same MOVPE equipment. Thereby, the attachment of impurities to the main surface of the second AlN layer before the formation of the electron transit layer 30 can be suppressed, and thus the contamination of the electron transit layer 30 can be suppressed. The thickness of the second AlN layer in the modified example is, for example, preferably 10 nm or more and 200 nm or less.

EXAMPLES

Explanation will be given for various experimental results supporting an effect of the present disclosure hereafter.

(1) Experiment 1

(1-1) Fabrication of Group III Nitride Laminate

Under the following conditions, a plurality of laminates different in thickness of the nucleation layer were fabricated.

Figure 5:
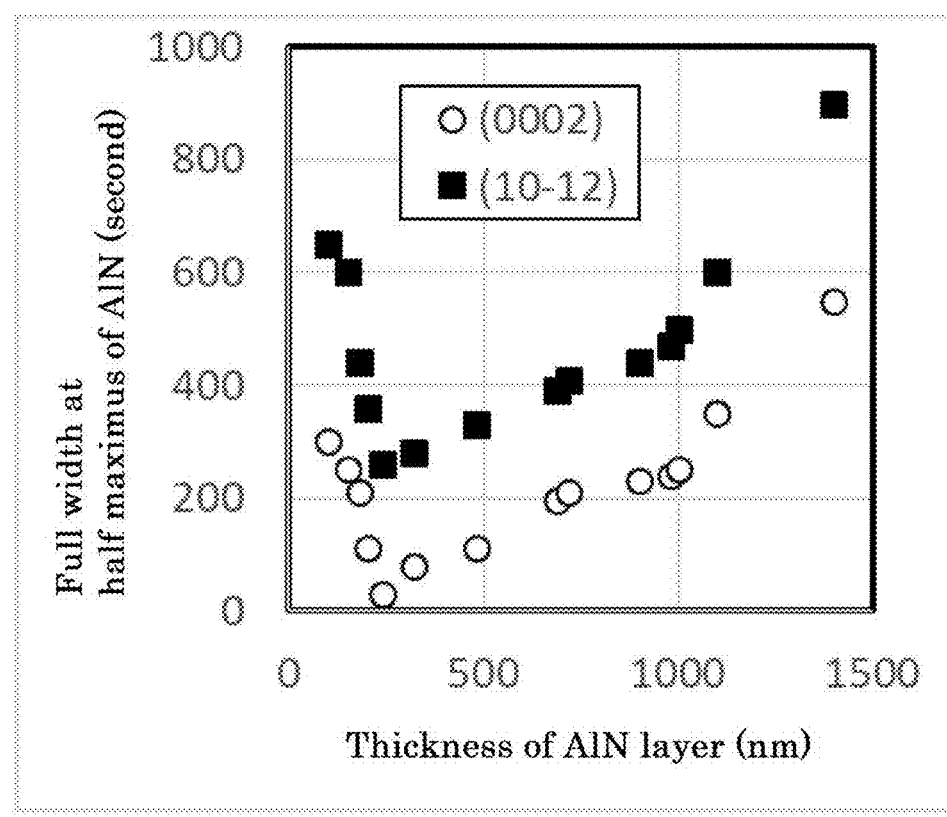
FIG. 5 is a view illustrating a full width at half maximum of each of (0002) diffraction and (10-12) diffraction of AlN with respect to an AlN layer in Experiment 1.

[Conditions for Fabricating Laminate]
(Underlying Substrate)
　　Material: SiC (semi-insulating)
　　Diameter: 2 inches
　　Thickness: 400 μm
　　Crystal plane with a low index closest to base surface: c-plane (without performing patterning process on base surface)
　　Polytype: 4H
(Nucleation Layer)
　　Material: AlN
　　Growth method: HVPE method
　　Growth temperature: 1020° C.
　　Growth pressure: 0.987 atm (100 kPa)
　　AlCl Partial pressure: 0.8 kPa
　　V/III ratio: 50
　　Growth rate: 100 nm/min
　　Thickness: Varied within a range of about 100 nm or more and 1400 nm or less
(Heat Treatment Step)
　　Atmosphere: $H_2$ gas ($NH_3$ gas partial pressure is less than 1% based on the entire pressure)
　　Heat treatment temperature: 1220° C.
　　Heat treatment time: 60 minutes
(1-2) Evaluation
(X-Ray Rocking Curve Analysis)
　　In each of the laminates of the above-mentioned Experiment 1, X-ray rocking curve analysis of (0002) diffraction of AlN and X-ray rocking curve analysis of (10-12) diffraction of AlN were performed. As a result, the full width at half maximum (FWHM) of (0002) diffraction of AlN and the full width at half maximum of (10-12) diffraction of AlN were determined.
(1-3) Results
　　The results of the X-ray rocking curve analysis of Experiment 1 will be described with reference to FIG. 5. FIG. 5 is a view illustrating the full width at half maximum of each of (0002) diffraction of AlN and (10-12) diffraction of AlN with respect to the thickness of the AlN layer in Experiment 1.
　　As illustrated in FIG. 5, when the full width at half maximum of each of (0002) and (10-12) diffractions of AlN determined through X-ray rocking curve analysis is plotted against the thickness of the AlN layer as the nucleation layer to which the above-mentioned production method is applied, the full width at half maximum of the X-ray diffraction of AlN tends to show a downward convex.
　　When the thickness of the AlN layer as the nucleation layer is more than 100 nm and 1 μm or less, it is confirmed that a full width at half maximum of (0002) diffraction of AlN determined through X-ray rocking curve analysis is 250 seconds or less, and a full width at half maximum of (10-12) diffraction of AlN determined through X-ray rocking curve analysis is 500 seconds or less.
　　When the thickness of the AlN layer as the nucleation layer is 200 nm or more and 700 nm or less, it is confirmed that the full width at half maximum of (0002) diffraction of AlN determined through X-ray rocking curve analysis is 200 seconds or less, and the full width at half maximum of (10-12) diffraction of AlN determined through X-ray rocking curve analysis is 400 seconds or less.
　　When the thickness of the AlN layer as the nucleation layer is 300 nm or more and 500 nm or less, it is confirmed that the full width at half maximum of (0002) diffraction determined through X-ray rocking curve analysis is 180 seconds or less, and the full width at half maximum of (10-12) diffraction determined through X-ray rocking curve analysis is 380 seconds or less.

Figure 6:
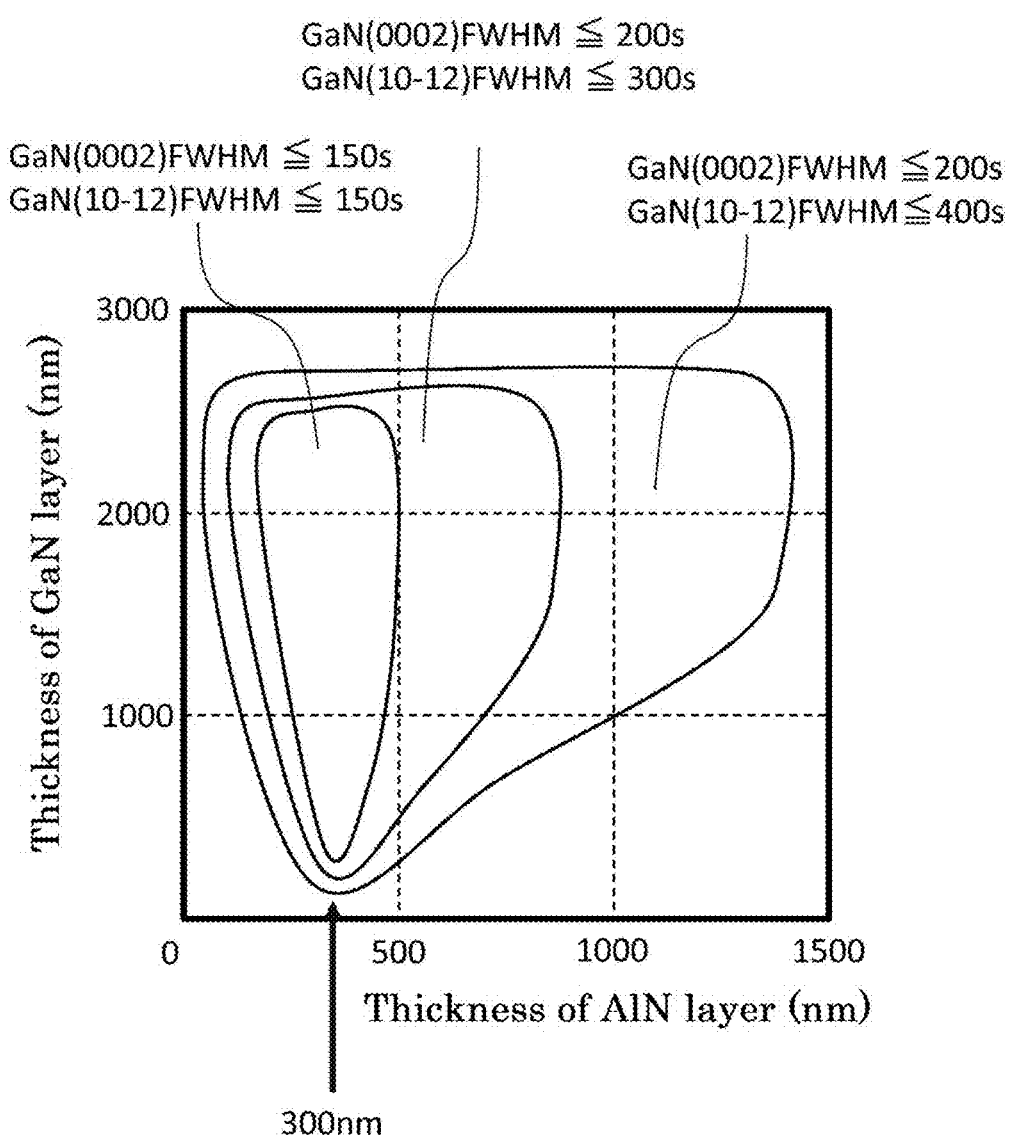
FIG. 6 is a view illustrating ranges of the thickness of the AlN layer and the thickness of the GaN layer when the full width at half maximum of each of (0002) diffraction and (10-12) diffraction of GaN satisfies predetermined conditions in Experiment 2.

(2) Experiment 2
(2-1) Fabrication of Group III Nitride Laminate
　　In Experiment 2, a plurality of laminates different in thickness of each of the nucleation layer and the electron transit layer were fabricated using the laminates of Experiment 1 under the following conditions.
[Conditions for Fabricating Laminate]
(Underlying Substrate, Nucleation Layer, and Heat Treatment Conditions)
　　Same as in Experiment 1.
(Electron Transit Layer)
　　Material: GaN
　　Growth method: MOVPE method
　　Growth conditions: the following conditions for lateral growth
　　Growth temperature: 1120° C.
　　Growth pressure: 0.4 atm
　　TMG flow rate: 50 sccm
　　V/III ratio: 5000
　　Growth rate: 20 nm/min
　　Without intentional doping impurities
　　Thickness: Varied within a range of about 100 nm or more and 2800 nm or less
(2-2) Evaluation
(X-Ray Rocking Curve Analysis)
　　In each of the laminates of the above-mentioned Experiment 2, X-ray rocking curve analysis of (0002) diffraction of GaN and an X-ray rocking curve analysis of (10-12) diffraction of GaN were performed. As a result, the full width at half maximum (FWHM) of (0002) diffraction of GaN and the full width at half maximum of (10-12) diffraction of GaN were determined.
(Observation with Multiphoton Excitation Microscope)
　　The main surface of the electron supply layer was observed using a multiphoton excitation microscope, in a laminate in which the thickness of the nucleation layer including AlN is more than 100 nm and 1 μm or less, and the thickness of the electron supply layer including GaN is 100 nm or more and less than 1 μm.
(2-3) Results
(X-Ray Rocking Curve Analysis)
　　The results of the X-ray rocking curve analysis of Experiment 2 will be described with reference to FIG. 6. FIG. 6 illustrates a range of the thickness of the AlN layer and the thickness of the GaN layer when the full width at half maximum of each of (0002) diffraction and (10-12) diffraction of GaN satisfies a predetermined condition in Experiment 2. In FIG. 6, the outermost area of the area surrounded by the solid line indicates an area where the full width at half maximum of (0002) diffraction of GaN is 200 seconds or less, and the full width at half of (10-12) diffraction of GaN is 400 seconds or less. The intermediate area indicates an area where the full width at half maximum of (0002) diffraction of GaN is 200 seconds or less, and the full width at half of (10-12) diffraction of GaN is 300 seconds or less. The innermost area indicates an area where the full width at half maximum of (0002) diffraction of GaN is 150 seconds or less, and the full width at half of (10-12) diffraction of GaN is 150 seconds or less.
　　As illustrated in FIG. 6, when the thickness of the GaN layer as the electron transit layer is a predetermined value, the full width at half maximum of X-ray diffraction of GaN depends on the thickness of the AlN layer as the nucleation layer. That is, it is confirmed that the crystallinity of the GaN layer improves as the thickness of the AlN layer approaches the thickness with which the full width at half maximum of X-ray diffraction of AlN becomes minimum.

When the thickness of the AlN layer as the nucleation layer is about 300 nm with which the full width at half maximum of X-ray diffraction of AlN becomes minimum, it is confirmed that, in the GaN layer as the electron transit layer, the full width at half maximum of (0002) diffraction of GaN determined through X-ray rocking curve analysis is 200 seconds or less, and the full width at half maximum of (10-12) diffraction of GaN determined through X-ray rocking curve analysis is 400 seconds or less, so long as the thickness of the GaN layer as the electron transit layer is 2600 nm or less.

From these results, it is confirmed that the electron transit layer can be grown so that the full width at half maximum of (0002) diffraction of GaN determined through X-ray rocking curve analysis is 200 seconds or less, and the full width at half maximum of (10-12) diffraction of GaN determined through X-ray rocking curve analysis is 400 seconds or less, while a thickness of the GaN layer as the electron transit layer is less than 1 μm, so long as the thickness of the AlN layer as the nucleation layer is optimized to improve the crystallinity of the above-mentioned AlN layer.

(Dislocation Density)

As a result of observation with a multiphoton excitation microscope, it is confirmed that the dislocation density in the main surface of the electron supply layer is $5 \times 10^8$ cm$^{-2}$ or less in a laminate in which the thickness of the nucleation layer including AlN is more than 100 nm and 1 μm or less, and the thickness of the electron supply layer including GaN is 100 nm or more and less than 1 μm.

(3) Experiment 3

(3-1) Fabrication of Semiconductor Element

In Experiment 3, the semiconductor elements of Example and Comparative Examples 1 to 3 were fabricated under the following conditions.

The structure of the semiconductor elements of Example, and Comparative Example 1 to Comparative Example 3 will be hereinafter described with reference to FIG. 7A, FIG. 8A, FIG. 9A, and FIG. 10A. FIG. 7A, FIG. 8A, FIG. 9A, and FIG. 10A are schematic cross-sectional views illustrating semiconductor elements of Example, and Comparative Example 1 to Comparative Example 3 of Experiment 3. Note that the scale is not unified among the above drawings.

[Conditions for Fabricating Semiconductor Element of Example]

(Underlying Substrate, Nucleation Layer, Heat Treatment Conditions, and Electron Transit Layer)

Same as in Experiment 2.

That is, the growth condition of the electron transit layer is a condition for lateral growth without doping, provided that:

Thickness of nucleation layer (AlN layer): 300 nm

Thickness of electron transit layer (GaN layer): 400 nm (Electron Supply Layer)

Composition: $Al_{0.25}Ga_{0.75}N$

Growth method: MOVPE method

Thickness: 25 nm (Cap Layer)

Material: GaN

Growth method: MOVPE method

Thickness: 2.5 nm (Electrode)

Gate electrode: Ni/Au, formed in contact with electron supply layer.

Source electrode and drain electrode: Ti/Al, formed in contact with cap layer.

The gate length was 10 μm, the gate width was 100 μm, the gate-source distance was 5 μm, and the gate-drain distance was 5 μm. Further, the source electrode length and the drain electrode length were 100 μm each. In the adjacent elements, the distance between a source electrode of one element and a drain electrode of the other element was 50 μm.

(Separation of Elements)

The laminate was etched in a depth of 200 nm and a width of 10 μm from the front surface side so that each periphery of the semiconductor element region was surrounded to separate a plurality of semiconductor elements in the plane from one another.

[Conditions for Fabricating Semiconductor Element of Comparative Example 1]

(Underlying Substrate)

Same as in Example (Conditions for Each Layer)

Growth method for all layers: MOVPE method

Thickness of nucleation layer (AlN layer): 10 nm

Thickness of electron transit layer (undoped GaN layer): 1500 nm

In the initial growth stage, the electron transit layer was three-dimensionally grown.

Thickness of electron supply layer ($Al_{0.25}Ga_{0.75}N$ layer): 25 nm (same as in Example)

Thickness of cap layer (GaN layer): 2.5 nm (same as in Example)

Each electrode: Same as in Example

[Conditions for Fabricating Semiconductor Element of Comparative Example 2]

(Underlying Substrate)

Same as in Example (Conditions for Each Layer)

Growth method for all layers: MOVPE method

Thickness of nucleation layer (AlN layer): 10 nm

Thickness of semi-insulating layer (C-doped GaN layer): 1000 nm

Thickness of electron transit layer (undoped GaN layer): 500 nm

In the initial growth stage, the electron transit layer was three-dimensionally grown.

Thickness of electron supply layer ($Al_{0.25}Ga_{0.75}N$ layer): 25 nm (same as in Example)

Thickness of cap layer (GaN layer): 2.5 nm (same as in Example)

Each electrode: Same as in Example

In the growth step of the semi-insulating layer (C-doped GaN layer), the V/III ratio was about 2000. Thereby, C was doped into the semi-insulating layer.

[Conditions for Fabricating Semiconductor Element of Comparative Example 3]

(Underlying Substrate)

Same as in Example (Conditions for Each Layer)

Growth method for all layers: MOVPE method

Thickness of nucleation layer (AlN layer): 10 nm

Thickness of semi-insulating layer (Fe-doped GaN layer): 800 nm

Thickness of electron transit layer (undoped GaN layer): 700 nm

In the initial growth stage, the electron transit layer was three-dimensionally grown.

Thickness of electron supply layer ($Al_{0.25}Ga_{0.75}N$ layer): 25 nm (same as in Example)

Thickness of cap layer (GaN layer): 2.5 nm (same as in Example)

Each electrode: Same as in Example
(3-2) Evaluation
(Secondary Ion Mass Spectrometry: SIMS))
SIMS was performed from the front surface side of the semiconductor element for each of Example, and Comparative Example 1 to Comparative Example 3.
(Device Characteristics: Threshold Voltage Fluctuation)
In the semiconductor element of each of Example, and Comparative Example 1 to Comparative Example 3, the drain current $I_d$ was measured with respect to the gate voltage $V_g$ as the initial characteristic under the condition where the drain-source voltage $V_{ds}$ was 50 V, and the threshold voltage $V_{th}$ of the gate voltage $V_g$ when the drain current $I_d$ rose was determined. Next, stress was applied to each of the semiconductor element under the following conditions: the gate voltage $V_g$ was −5 V, 2DEG was pinched off, drain-source voltage $V_{ds}$ was 50 V, and the application time was 30 seconds. After application of the stress, the drain current $I_d$ was measured with respect to the gate voltage $V_g$ under the same conditions as in the measurement of the initial characteristics, and the threshold voltage $V_{th}'$ of the gate voltage $V_g$ after application of the stress was determined.
Now, the device characteristics in an example of the conventional semiconductor element will be described with reference to FIG. 11A. FIG. 11A is a view illustrating an example of a drain current with respect to a gate voltage in a conventional semiconductor element. In FIG. 11A, "Before" indicates the characteristics before application of the above-mentioned stress, and "After" indicates the characteristics after application of the above-mentioned stress.
As illustrated in FIG. 11A, in the conventional semiconductor element, since the charging and discharging of impurities introduced in a part of the operation layer occur due to the stress application, the threshold voltage of the gate voltage after application of the stress may fluctuate.
Therefore, in each of the semiconductor elements of Example and Comparative Example 1 to Comparative Example 3, the threshold voltage fluctuation $\Delta V_{th}$ ($=V_{th}'-V_{th}$) of the gate voltage $V_g$ was determined based on the threshold voltage $V_{th}$ before application of the stress and the threshold voltage $V_{th}'$ after application of the stress determined as mentioned above.
(Device Characteristics: Buffer Leakage Current)
In each of Example, Comparative Example 1 to Comparative Example 3, 100 V was applied between a source electrode of one element and a drain electrode of the other element (interval, 50 μm) in adjacent elements, and buffer leakage current between the elements was measured. In this case, the unetched regions within one semiconductor element region are electrically connected via two-dimensional electron gas (2DEG). Therefore, it means that the buffer leakage current is measured in a region having a length of 100 μm, which corresponding to the length of each of the source electrode and the drain electrode, and a width of the etching of 10 μm.
(3-3) Results
(SIMS)
Results of SIMS of Experiment 3 will be described below with reference to FIG. 7B, FIG. 8B, FIG. 9B, and FIG. 10B. FIG. 7B, FIG. 8B, FIG. 9B, and FIG. 10B are schematic cross-sectional views illustrating the SIMS results of Example, Comparative Example 1, Comparative Example 2, and Comparative Example 3 of Experiment 3.
As illustrated in FIG. 8B, in Comparative Example 1, Si was detected at a concentration of more than $1 \times 10^{16}$ cm$^{-3}$ on the underlying substrate side of the undoped GaN layer as the electron transit layer. As mentioned above, in Comparative Example 1, the AlN layer having a thin thickness (10 nm) according to a prior art was formed as the nucleation layer. Therefore, it is considered that Si diffused from the SiC substrate as the underlying substrate, and the Si concentration on the underlying substrate side of the undoped GaN layer was more than $1 \times 10^{16}$ cm$^{-3}$. In Comparative Example 1, since the GaN crystal was three-dimensionally grown at the initial stage of growing the undoped GaN layer, O was introduced through the facet other than the c-plane, and O was detected at a concentration close to $1 \times 10^{17}$ cm$^{-3}$ on the underlying substrate side of the undoped GaN layer. In Comparative Example 1, C was detected at a concentration of about $6 \times 10^{15}$ cm$^{-3}$ uniformly in the depth direction in the undoped GaN layer.

Figure 9A:
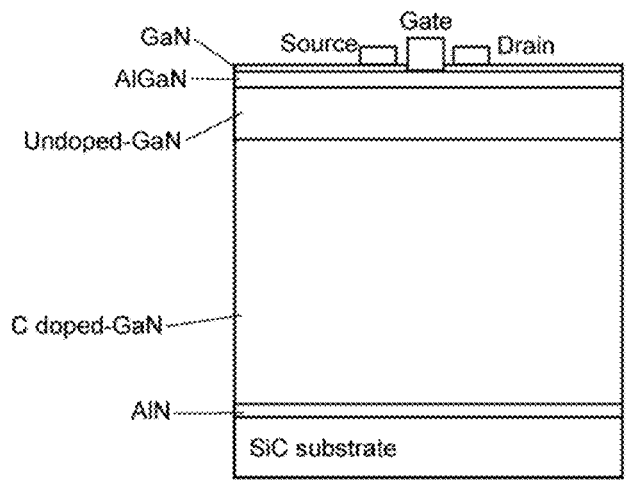
FIG. 9A is a schematic cross-sectional view illustrating a semiconductor element of Comparative Example 2 of Experiment 3.
Figure 9B:
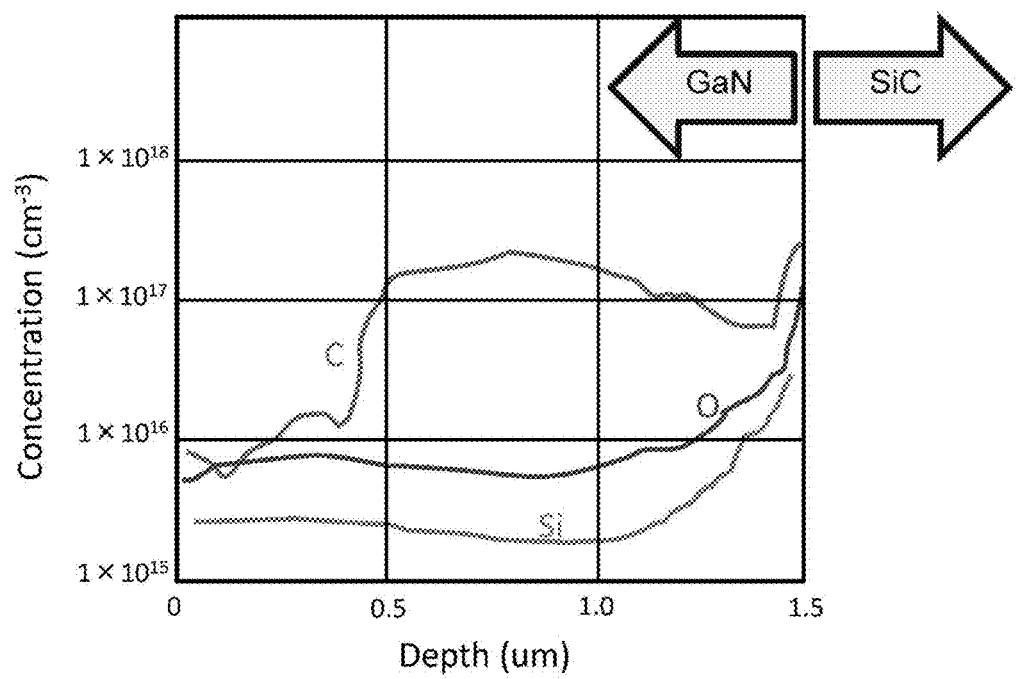
FIG. 9B is a view illustrating a SIMS result of Comparative Example 2 of Experiment 3.

As illustrated in FIG. 9B, in the Comparative Example 2, the thickness of the AlN layer as the nucleation layer was thin, and Si diffused from the SiC substrate as the underlying substrate, as in Comparative Example 1, so that Si was detected on the underlying substrate side of the C-doped GaN layer as the semi-insulating layer at a concentration of more than $1 \times 10^{16}$ cm$^{-3}$. In Comparative Example 2, since the GaN crystal was three-dimensionally grown at the initial stage of growing the C-doped GaN layer as the semi-insulating layer, O was introduced through the facet other than the c-plane. Therefore, O was detected at a concentration close to $1 \times 10^{17}$ cm$^{-3}$ on the underlying substrate side of the semi-insulating layer. On the other hand, in Comparative Example 2, since C was doped in the semi-insulating layer, C was detected at the concentration of more than $8 \times 10^{16}$ cm$^{-3}$ so as to compensate for at least a part of Si and O introduced in the semi-insulating layer.

Figure 10A:
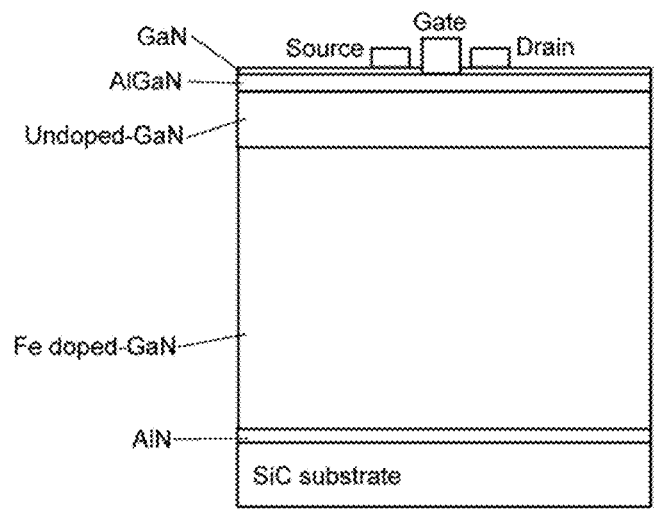
FIG. 10A is a schematic cross-sectional view illustrating a semiconductor element of Comparative Example 3 of Experiment 3.
Figure 10B:
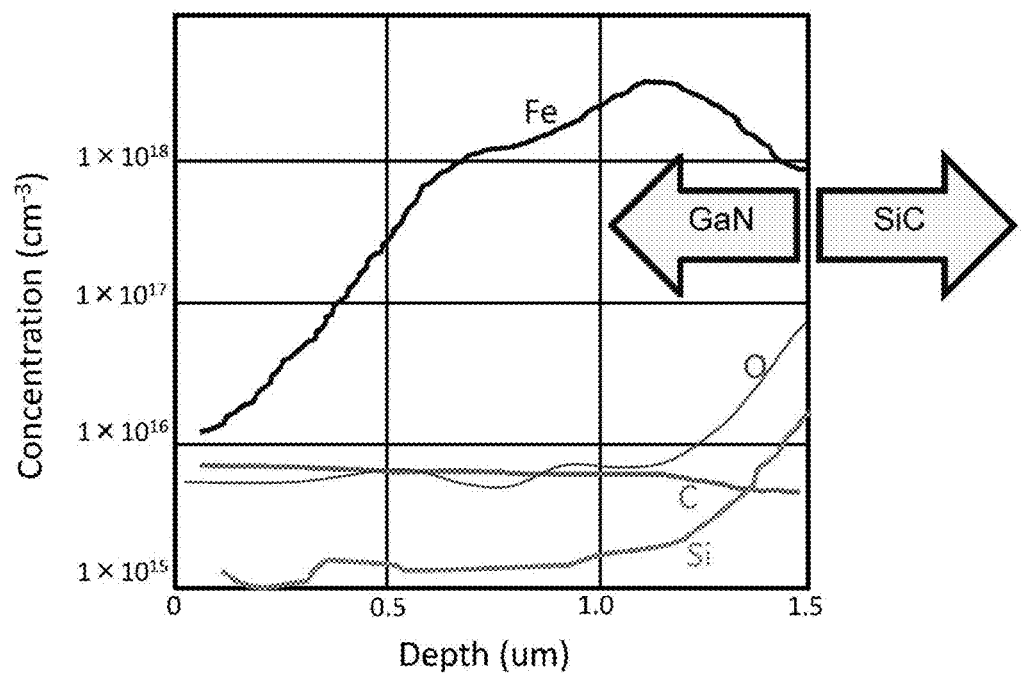
FIG. 10B is a view illustrating a SIMS result of Comparative Example 3 of Experiment 3.
Figure 11A:
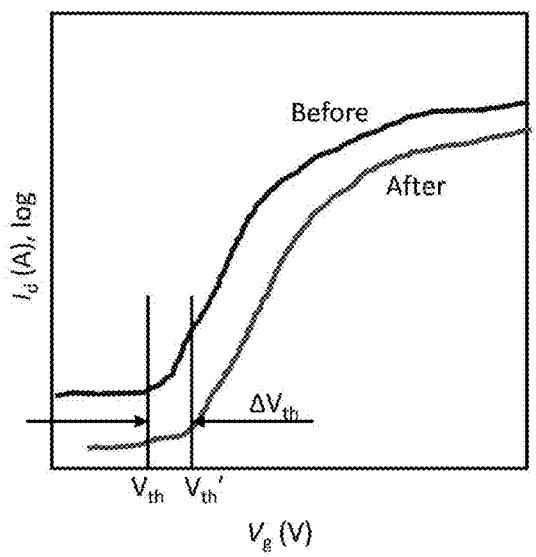
FIG. 11A is a view illustrating an example of a drain current with respect to a gate voltage in a conventional semiconductor element.

As illustrated in FIG. 10B, in the Comparative Example 3, the thickness of the AlN layer as the nucleation layer was thin, and Si diffused from the SiC substrate as the underlying substrate, as in Comparative Example 1, so that Si was detected on the underlying substrate side of the Fe-doped GaN layer as the semi-insulating layer at a concentration of more than $1 \times 10^{16}$ cm$^{-3}$. In Comparative Example 3, since the GaN crystal was three-dimensionally grown at the initial stage of growing the Fe-doped GaN layer as the semi-insulating layer, O was introduced through the facet other than the c-plane. Therefore, O was detected on the underlying substrate side of the semi-insulating layer at a concentration close to $1 \times 10^{17}$ cm$^{-3}$. On the other hand, in Comparative Example 3, since Fe was doped in the semi-insulating layer, Fe was detected at the concentration of more than $1 \times 10^{18}$ cm$^{-3}$ so as to sufficiently compensate for Si and O introduced in the semi-insulating layer.

Figure 7A:
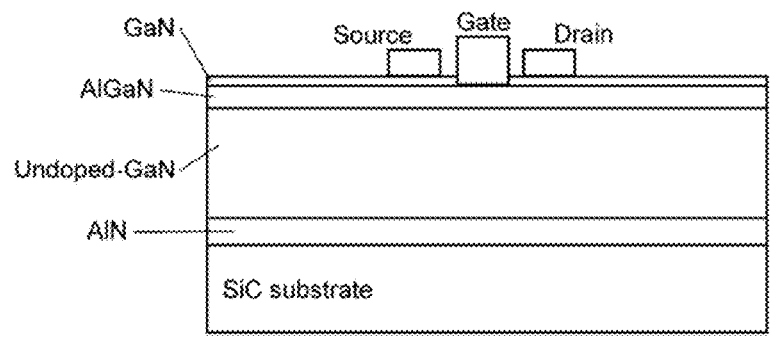
FIG. 7A is a schematic cross-sectional view illustrating a semiconductor element of Example of Experiment 3.
Figure 7B:
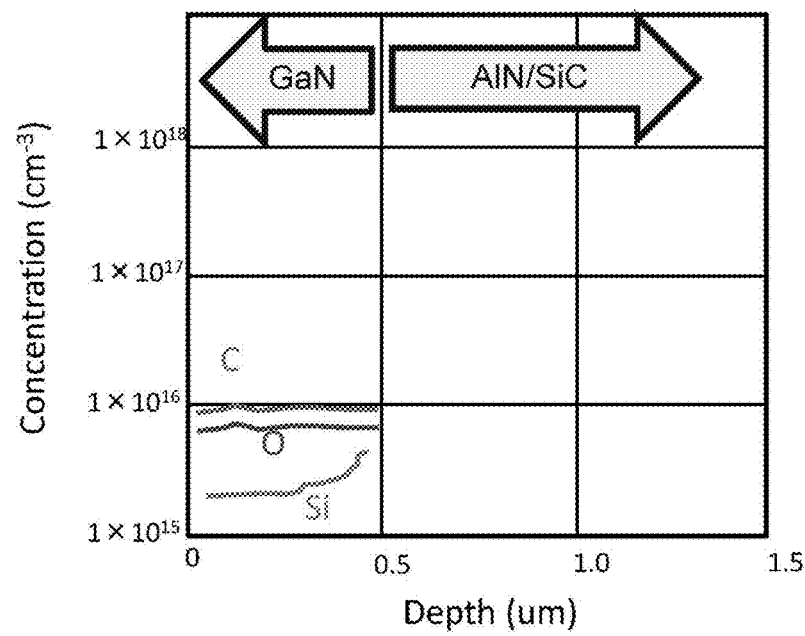
FIG. 7B is a schematic cross-sectional view illustrating a SIMS result of Example of Experiment 3.
Figure 8A:
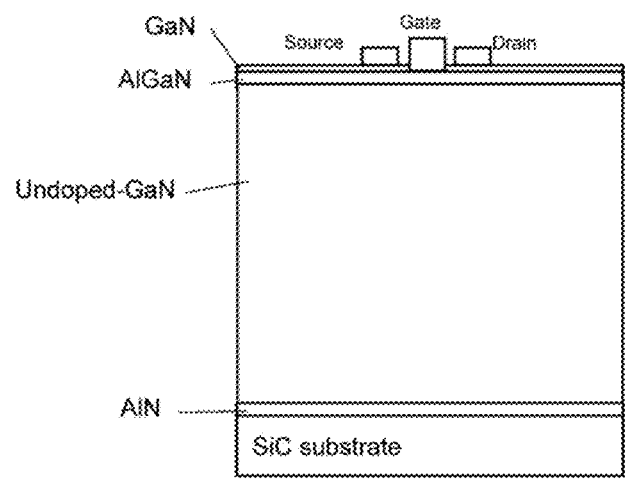
FIG. 8A is a schematic cross-sectional view illustrating a semiconductor element of Comparative Example 1 of Experiment 3.
Figure 8B:
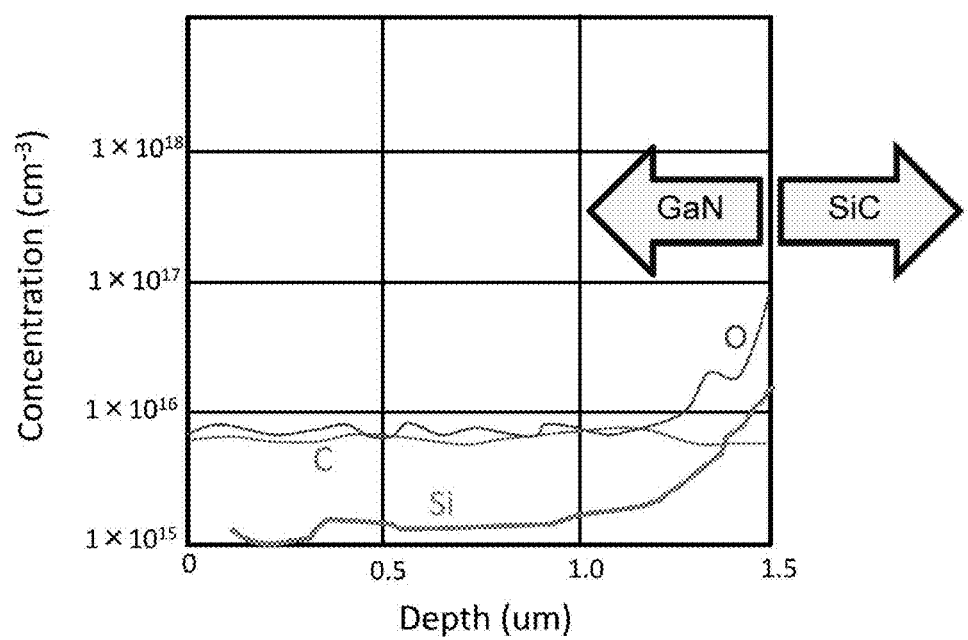
FIG. 8B is a view illustrating a SIMS result of Comparative Example 1 of Experiment 3.

In contrast, as illustrated in FIG. 7B, in Example, since the thickness of the AlN layer as the nucleation layer is more than 100 nm, the diffusion of Si from the SiC substrate as the underlying substrate toward the electron transit layer can be suppressed. Therefore, in Example, it is confirmed that the Si concentration in the electron transit layer can be $1 \times 10^{16}$ cm$^{-3}$ or less throughout the electron transit layer.

In Example, since the electron transit layer is laterally grown without being three-dimensionally grown, the introduction of impurities such as O through the facet other than the c-plane can be suppressed. Therefore, in Example, the O concentration in the electron transit layer can be $1 \times 10^{16}$ cm$^{-3}$ or less throughout the electron transit layer.

Further, in Example, impurities such as Fe and C were not intentionally doped in the electron transit layer. Therefore, in Example, it is confirmed that each of the Fe concentration and the C concentration in the electron transit layer can be $1 \times 10^{16}$ cm$^{-3}$ or less.

(Device Characteristics)

Figure 11B:
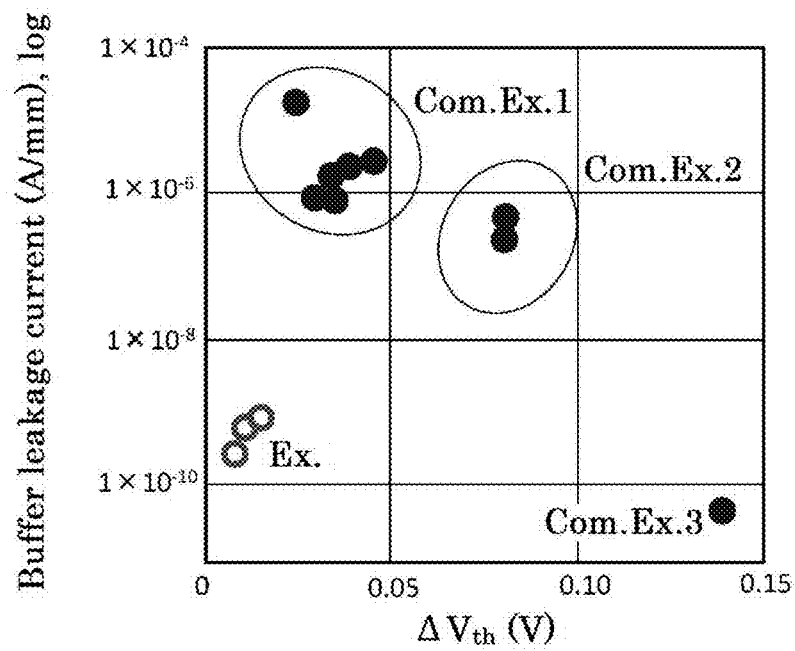
FIG. 11B is a view illustrating a buffer leakage current with respect to a threshold voltage fluctuation after application of the stress in Experiment 3.

The result of the device characteristics of Experiment 3 will be described with reference to FIG. 11B. FIG. 11B is a view illustrating a buffer leakage current with respect to a threshold voltage fluctuation after application of the stress in Experiment 3. In FIG. 11B, a value of a buffer leakage current is indicated as a current value per unit length of the source-drain electrode used for the measurement.

As illustrated in FIG. 11B, in Comparative Example 2 and Comparative Example 3, the threshold voltage fluctuation $\Delta V_{th}$ after application of the stress became larger because Fe or C forming a deep energy level was charged. On the other hand, in Comparative Example 2 and Comparative Example 3, since Fe or C compensated for Si and O as n-type impurities on the underlying substrate side, the buffer leakage current became smaller.

In contrast, in Comparative Example 1, the buffer leakage current became larger due to Si or O introduced as n-type impurities on the underlying substrate side. On the other hand, in Comparative Example 1, the buffer leakage current was increased, and thus charging of the impurities in the electron transit layer was hardly generated, so that threshold voltage fluctuation $\Delta V_{th}$ after application of the stress became smaller.

As a result mentioned above, in HEMT in Comparative Examples 1 to 3, it is confirmed that suppression of the buffer leakage current is hardly compatible with stable operation with suppressed threshold voltage fluctuation $\Delta V_{th}$.

In contrast, in Example, since the thickness of the AlN layer as the nucleation layer is more than 100 nm, the diffusion of Si as an n-type impurity from the SiC substrate as the underlying substrate to the electron transit layer can be suppressed. In Example, since the electron transit layer was laterally grown without being three-dimensionally grown, the introduction of O and the like as n-type impurities can be suppressed. Accordingly, in Example, it is confirmed that the buffer leakage current was reduced. Further, in Example, impurities such as Fe and C were not intentionally doped. Accordingly, in Example, it is confirmed that the threshold voltage fluctuation $\Delta V_{th}$ associated with the charging and discharging of impurities was reduced.

As a result mentioned above, in Example, it is confirmed that the suppression of the buffer leakage current can be compatible with the stable operation with suppressed threshold voltage fluctuation $\Delta V_{th}$.

(4) Experiment 4
(4-1) Fabrication of Semiconductor Element

In Experiment 4, the semiconductor elements corresponding to that of Example of Experiment 3 was fabricated under the following conditions.

[Conditions for Fabricating Semiconductor Element]

According to FIG. 6, the semiconductor element was fabricated in the same manner as in Example of Experiment 3 except that the crystallinity of GaN in the electron transit layer was varied.

(4-2) Evaluation
(X-Ray Rocking Curve Analysis)

In each of the semiconductor elements of the above-mentioned Experiment 4, X-ray rocking curve analysis of (10-12) diffraction of GaN in the electron transit layer was performed. As a result, the full width at half maximum of the (10-12) diffraction of GaN in the electron transit layer was determined.

(Device Characteristics: Element Service Life)

In the semiconductor element of Experiment 4, the semiconductor element was driven under the conditions in which the temperature was 150° C., the gate voltage $V_g$ was −2 V, and the drain-source voltage $V_{ds}$ was 50 V. Then, the time when the gate current (gate leakage current) $I_g$ exceeded $1 \times 10^{-4}$ A/mm from an initial value of less than $1 \times 10^{-8}$ A/mm was evaluated as an element service life. A value of the gate leakage current is a value per unit length (1 mm) of the gate electrode width.

(4-3) Results

Figure 12:
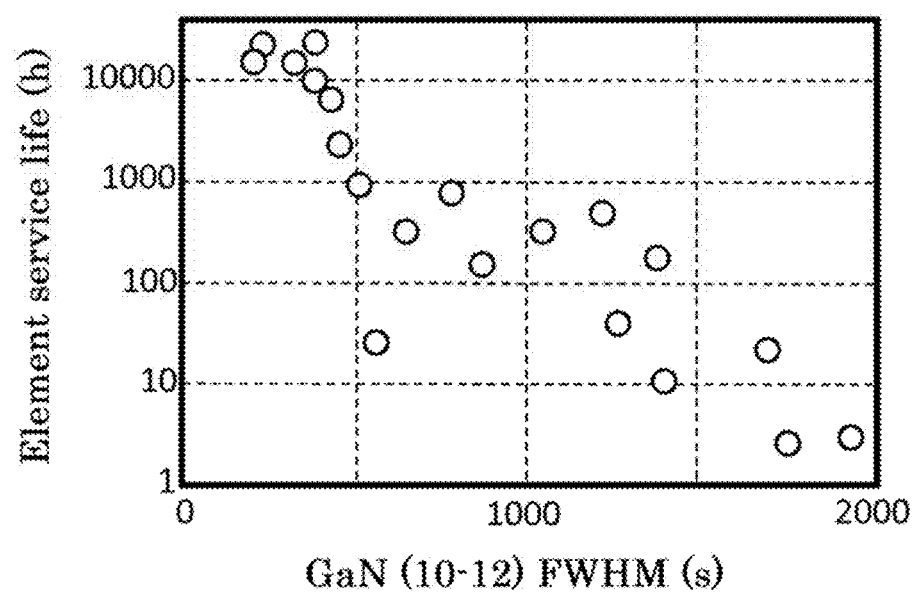
FIG. 12 is a view illustrating an element service life with respect to a full width at half maximum of (10-12) diffraction of GaN in an electron transit layer in Experiment 4.

Results of Experiment 4 will be described below with reference to FIG. 12. FIG. 12 is a view illustrating an element service life with respect to a full width at half maximum of (10-12) diffraction of GaN in an electron transit layer in Experiment 4.

As illustrated in FIG. 12, as the full width at half maximum of the (10-12) diffraction of GaN in the electron transit layer of the semiconductor element decreases (to the left in the figure, that is, as the crystallinity improves), the above-mentioned element service life exhibits a trend to increase monotonically. In other words, it is confirmed that since the crystallinity of the nucleation layer is improved, and the crystallinity of the electron transit layer formed on the nucleation layer is improved, the element service life can be elongated. Specifically, the full width at half maximum of (10-12) diffraction of GaN in the electron transit layer is 400 seconds or less, so that the element service life under the above-mentioned driving conditions can be more than 10000 hours, which corresponds to a service life of a semiconductor element for a practical use.

<Preferable Aspects of the Present Disclosure>

Preferable aspects of the present disclosure will be supplementarily described hereafter.

(Supplementary Description 1)

A group III nitride laminate, including:
an underlying substrate,
a first layer including aluminum nitride provided on the underlying substrate, and
a second layer including gallium nitride provided on the first layer;
wherein, in the first layer, a thickness is more than 100 nm and 1 μm or less, a full width at half maximum of (0002) diffraction determined through X-ray rocking curve analysis is 250 seconds or less, and a full width at half maximum of (10-12) diffraction determined through X-ray rocking curve analysis is 500 seconds or less.

(Supplementary Description 2)

The group III nitride laminate according to the supplementary description 1,
wherein a thickness of the second layer is less than 1 μm, and a dislocation density on a main surface of the second layer is $5 \times 10^8$ cm$^{-2}$ or less.

(Supplementary Description 3)

The group III nitride laminate according to the supplementary description 1 or 2,
wherein, in the second layer, the thickness is less than 1 μm, the full width at half maximum of (0002) diffraction determined through X-ray rocking curve analysis is 200 seconds or less, and the full width at half maximum of (10-12) diffraction determined through X-ray rocking curve analysis is 400 seconds or less.

(Supplementary Description 4)

The group III nitride laminate according to any one of the supplementary descriptions 1 to 3,
wherein an oxygen concentration in the second layer is $1 \times 10^{16}$ cm$^{-3}$ or less throughout the second layer.

(Supplementary Description 5)

The group III nitride laminate according to any one of the supplementary descriptions 1 to 4, wherein a silicon concentration in the second layer is $1\times10^{16}$ cm$^{-3}$ or less throughout the second layer.

(Supplementary Description 6)

The group III nitride laminate according to any one of the supplementary descriptions 1 to 5, wherein each of an iron concentration and a carbon concentration in the second layer is $1\times10^{16}$ cm$^{-3}$ or less.

(Supplementary Description 7)

The group III nitride laminate according to any one of the supplementary descriptions 1 to 6, wherein, in the first layer, the thickness is 200 nm or more and 700 nm or less, the full width at half maximum of (0002) diffraction determined through X-ray rocking curve analysis is 200 seconds or less, and the full width at half maximum of (10-12) diffraction determined through X-ray rocking curve analysis is 400 seconds or less.

(Supplementary Description 8)

The group III nitride laminate according to any one of the supplementary descriptions 1 to 7, wherein, in the first layer, the thickness is 300 nm or more and 500 nm or less, the full width at half maximum of (0002) diffraction determined through X-ray rocking curve analysis is 180 seconds or less, and the full width at half maximum of (10-12) diffraction determined through X-ray rocking curve analysis is 380 seconds or less.

(Supplementary Description 9)

The group III nitride laminate according to any one of the supplementary descriptions 1 to 8, wherein the underlying substrate includes silicon carbide or sapphire.

(Supplementary Description 10)

The group III nitride laminate according to any one of the supplementary descriptions 1 to 9, further including a third layer which is provided on the second layer and includes group III nitride having a band gap wider than that of gallium nitride.

(Supplementary Description 11)

A semiconductor element, including:

the second layer included in the group III nitride laminate according to any one of the supplementary descriptions 1 to 10 as at least a part of an operation layer.

(Supplementary Description 12)

A group III nitride laminate, including:

an underlying substrate, and a first layer including aluminum nitride provided on the underlying substrate, wherein, in the first layer, a thickness is more than 100 nm and 1 μm or less, a full width at half maximum of (0002) diffraction determined through X-ray rocking curve analysis is 250 seconds or less, and a full width at half maximum of (10-12) diffraction determined through X-ray rocking curve analysis is 500 seconds or less.

(Supplementary Description 13)

The group III nitride laminate according to the supplementary description 12, wherein the first layer has a main surface on which a second layer including gallium nitride is formed;

the main surface of the first layer is configured to enable the second layer to be grown so that a dislocation density on a main surface of the second layer is $5\times10^8$ cm$^{-2}$ or less while the thickness of the second layer is less than 1 μm.

(Supplementary Description 14)

The group III nitride laminate according to the supplementary description 12 or 13, wherein the first layer has a main surface on which the second layer including gallium nitride is formed, and the main surface of the first layer is configured to enable the second layer to be grown so that a full width at half maximum of (0002) diffraction of the second layer determined through X-ray rocking curve analysis is 200 seconds or less, and a full width at half maximum of (10-12) diffraction of the second layer determined through X-ray rocking curve analysis is 400 seconds or less, while a thickness of the second layer is less than 1 μm.

(Supplementary Description 15)

A method of producing a group III nitride laminate, including:

forming a first layer including aluminum nitride on an underlying substrate, performing a heat treatment of the first layer under an atmosphere containing hydrogen gas, and forming a second layer including gallium nitride on the first layer;

wherein, in formation of the first layer, the first layer is formed so that a full width at half maximum of (0002) diffraction of the first layer determined through X-ray rocking curve analysis is 250 seconds or less, and a full width at half maximum of (10-12) diffraction of the first layer determined through X-ray rocking curve analysis is 500 seconds or less, while a thickness of the first layer is more than 100 nm and 1 μm or less.

DESCRIPTION OF REFERENCE NUMERALS

1: Group III nitride laminate (laminate)
2: Semiconductor element
10: Underlying substrate
20: Nucleation layer
30: Electron transit layer
40: Electron supply layer
50: Cap layer

What is claimed is:

1. A group III nitride laminate, comprising:
   an underlying substrate, which is a silicon carbide substrate or a sapphire substrate,
   a first layer including aluminum nitride provided on the underlying substrate, and
   a second layer including gallium nitride provided on the first layer;
   wherein, in the first layer, a thickness is more than 100 nm and 1 μm or less, a full width at half maximum of (0002) diffraction determined through X-ray rocking curve analysis is 250 arcseconds or less, and a full width at half maximum of (10-12) diffraction determined through X-ray rocking curve analysis is 500 arcseconds or less.

2. The group III nitride laminate according to claim 1, wherein a thickness of the second layer is less than 1 μm, and a dislocation density on a main surface of the second layer is $5\times10^8$ cm$^{-2}$ or less.

3. The group III nitride laminate according to claim 1, wherein, in the second layer, the thickness is less than 1 μm, the full width at half maximum of (0002) diffraction determined through X-ray rocking curve analysis is 200 arcseconds or less, and the full width at half maximum of (10-12) diffraction determined through X-ray rocking curve analysis is 400 arcseconds or less.

4. The group III nitride laminate according to claim 1, wherein an oxygen concentration in the second layer is $1\times10^{16}$ cm$^{-3}$ or less throughout the second layer.

5. The group III nitride laminate according to claim 1, wherein a silicon concentration in the second layer is $1\times10^{16}$ cm$^{-3}$ or less throughout the second layer.

6. The group III nitride laminate according to claim 1, wherein each of an iron concentration and a carbon concentration in the second layer is $1\times10^{16}$ cm$^{-3}$ or less.

7. The group III nitride laminate according to claim 1, wherein, in the first layer, the thickness is 200 nm or more and 700 nm or less, the full width at half maximum of (0002) diffraction determined through X-ray rocking curve analysis is 200 arcseconds or less, and the full width at half maximum of (10-12) diffraction determined through X-ray rocking curve analysis is 400 arcseconds or less.

8. The group III nitride laminate according to claim 1, further comprising a third layer which is provided on the second layer and includes group III nitride having a band gap wider than that of gallium nitride.

9. A semiconductor element, comprising:
the second layer included in the group III nitride laminate according to claim 1 as at least a part of semiconductor layer.

10. A group III nitride laminate, comprising:
an underlying substrate, which is a silicon carbide substrate or a sapphire substrate, and
a first layer including aluminum nitride provided on the underlying substrate,
wherein, in the first layer, a thickness is more than 100 nm and 1 μm or less, a full width at half maximum of (0002) diffraction determined through X-ray rocking curve analysis is 250 arcseconds or less, and a full width at half maximum of (10-12) diffraction determined through X-ray rocking curve analysis is 500 arcseconds or less.

11. The group III nitride laminate according to claim 1, wherein the first layer and the second layer have a crystal strain.

12. The group III nitride laminate according to claim 1, wherein the underlying substrate is a silicon carbide substrate, and the first layer and the second layer have a tensile strain in a <11-20> axis direction.

13. The group III nitride laminate according to claim 1, wherein the underlying substrate is a sapphire substrate, and the first layer and the second layer have a compressive strain in a <11-20> axis direction.

* * * * *